(12) United States Patent  (10) Patent No.: US 7,126,999 B2
Dent  (45) Date of Patent: Oct. 24, 2006

(54) PSEUDO-POLAR MODULATION FOR RADIO TRANSMITTERS

(75) Inventor: Paul W. Dent, Pittsboro, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 611 days.

(21) Appl. No.: 10/639,164

(22) Filed: Aug. 11, 2003

(65) Prior Publication Data

US 2005/0046507 A1  Mar. 3, 2005

(51) Int. Cl.
*H04L 5/12* (2006.01)
*H04L 25/03* (2006.01)

(52) U.S. Cl. .................. 375/261; 375/297; 330/10
(58) Field of Classification Search .............. 375/261, 375/295–298, 300, 302; 330/10; 332/100, 332/103
See application file for complete search history.

(56) References Cited

U.S. PATENT DOCUMENTS

| | | |
|---|---|---|
| 3,054,073 A | 9/1962 | Powers |
| 3,906,401 A | 9/1975 | Seidel |
| 4,268,802 A | 5/1981 | Fisher et al. |
| 4,324,952 A | 4/1982 | Smiley |
| 4,373,115 A | 2/1983 | Kahn |
| 4,485,358 A | 11/1984 | Andren et al. |
| 4,509,017 A | 4/1985 | Andren et al. |
| 4,584,541 A | 4/1986 | Nossen |
| 4,700,151 A | 10/1987 | Nagata |
| 4,772,855 A | 9/1988 | Buoli et al. |
| 4,968,956 A | 11/1990 | Huang |
| 4,972,440 A | 11/1990 | Ernst et al. |
| 5,121,077 A | 6/1992 | McGann |
| 5,339,054 A | 8/1994 | Taguchi |
| 5,420,536 A | 5/1995 | Faulkner et al. |
| 5,430,416 A | 7/1995 | Black et al. |
| 5,450,044 A | 9/1995 | Hulick |
| 5,491,454 A | 2/1996 | Matz |
| 5,506,546 A | 4/1996 | Kowaguchi |
| 5,705,959 A | 1/1998 | O'Loughlin |
| 5,847,602 A * | 12/1998 | Su ........................ 330/10 |
| 6,101,224 A | 8/2000 | Lindoff et al. |
| 6,194,963 B1 | 2/2001 | Camp |
| 6,983,025 B1 * | 1/2006 | Schell ................... 375/296 |
| 2004/0080364 A1 * | 4/2004 | Sander et al. ........... 330/10 |

FOREIGN PATENT DOCUMENTS

| | | |
|---|---|---|
| EP | 0522525 A1 | 1/1993 |
| EP | 0360178 B1 | 11/1994 |
| EP | 1 035 701 A | 9/2000 |
| EP | 0705010 B1 | 1/2001 |

(Continued)

OTHER PUBLICATIONS

International Search Report and Written Opinion of the International Searching Authority for International Application No. PCT/US2004/022345 mailed on Jun. 2, 2005.

*Primary Examiner*—Don N. Vo

(57) ABSTRACT

Methods of modulating a radio transmitter. An amplitude modulation signal is generated based on in-phase (I) and quadrature (Q) components of an information signal, and so that it has a reduced predetermined characteristic compared to the magnitude of the I and Q components of the information signal. A complex signal is formed that has substantially the same phase angle variation as the I and Q components of the information signal so that the product of the complex signal and the amplitude modulation signal is substantially equal to the information signal.

38 Claims, 31 Drawing Sheets

FOREIGN PATENT DOCUMENTS

| | | |
|---|---|---|
| GB | 2 363 535 A | 12/2001 |
| JP | 05152981 | 6/1993 |
| JP | 09069733 | 3/1997 |

* cited by examiner

PSEUDO-POLAR MODULATION FOR RADIO TRANSMITTERS

BACKGROUND OF THE INVENTION

This invention relates to wireless communication transmitters, and more particularly to methods and radio transmitters that use pseudo-polar modulation to modulate phase and amplitude of an information signal.

It has long been known that any type of radio carrier modulation can be described in terms of a complex modulation, and the complex modulation can in turn be described either in terms of Cartesian (Real and Imaginary) waveform components or in terms of Polar (Amplitude and Phase) components. A single sideband signal (which varies in both phase and amplitude) can be formed from a constant-amplitude signal that is modulated in phase angle, with the phase part of the SSB signal and then modulating the constant-amplitude signal in amplitude with the amplitude part of the SSB signal.

There are many other forms of modulation apart from SSB that consist of varying phase and amplitude. One way to contain the transmission of a signal to an allocated channel, with minimum spectral spillover to adjacent channels, involves amplitude variation. This is because a signal modulated in phase alone is not perfectly bandlimited. A linear power amplifier is generally used to more faithfully reproduce the amplitude variations for containing the transmission spectrum. The linear power amplifier must pass the amplitude peaks without distortion, and therefore operates with a mean that is lower than its maximum output, and which may be lower than its maximum efficiency. Such linear amplifiers still however produce some distortion even when operated below their clipping point, because their amplitude-in to amplitude-out transfer characteristics are not completely linear.

Polar modulation may be used to reduce such distortion. Using polar modulation, an amplifier operates with a constant amplitude drive signal, and therefore does not need to have a linear amplitude-in to amplitude-out characteristic. The desired amplitude modulation is then applied after amplification, for example by modulating the power supply to the amplifier. However, this can give rise to another form of distortion, called AM-to-PM conversion, in which the amplitude modulation causes an inadvertent phase modulation. Feedback and feedforward techniques may be used to compensate for the known AM-PM tendency by adjusting phase modulation that is dependent on the amplitude modulation.

Polar modulation is supposed to produce a transmission that is more tightly spectrally contained than either a purely phase-modulated signal or a purely amplitude-modulated signal would be alone. Ideally, the out-of-band components of the amplitude modulation part cancel the out-of-band components of the phase modulation part. However, complete cancellation is prejudiced by errors in either part, such as due to different bandwidth restrictions, delay in the amplitude modulator compared to the phase modulator, and/or limited sampling rates.

BRIEF SUMMARY OF THE INVENTION

Some embodiments of the present invention provide methods of modulating a radio transmitter. An amplitude modulation signal is generated based on in-phase (I) and quadrature (Q) components of an information signal, and so that it has a reduced predetermined characteristic compared to the magnitude of the I and Q components of the information signal. A complex signal is formed that has substantially the same phase angle variation as the I and Q components of the information signal so that the product of the complex signal and the amplitude modulation signal is substantially equal to the information signal.

In some further embodiments of the present invention, the amplitude modulation signal is generated to have a reduced peak-to-trough amplitude and/or reduced spectral width relative to the information signal. A scaled information signal is generated by dividing the I and Q components of the information signal by the amplitude modulation signal. The scaled information signal is then amplified with a variable amplification based on the amplitude modulation signal. The amplitude modulation signal may be generated based on the following equation:

$$\overline{\sqrt{I^2+Q^2}+C}, \text{ wherein C is a non-zero constant.}$$

The information signal may be combined with a carrier signal to generate a channel information signal that is at least partially within a channel frequency range. The constant C may be selected to reduce amplitude of a portion of the channel information signal that is outside of the channel frequency range.

Various other embodiments of the present invention provide methods of controlling a power amplifier in a radio transmitter, and provide radio transmitters.

DETAILED DESCRIPTION OF THE INVENTION

Figure 1:
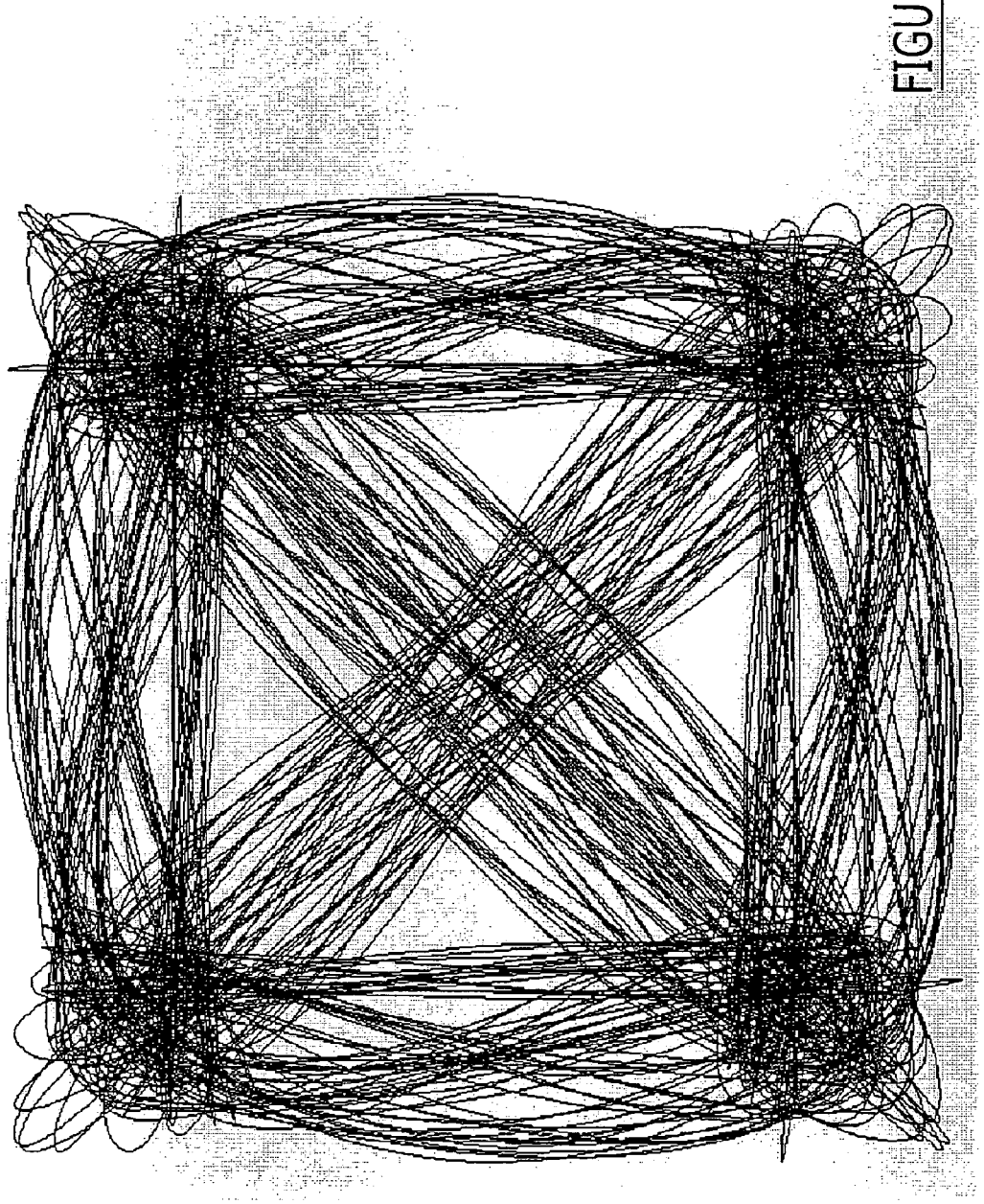
FIG. 1 illustrates a waveform trajectory of a root-raised-cosine filtered quadrature-phase-shift keyed (RRC-QPSK) signal in the complex plane.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

It also will be understood that, as used herein, the term "comprising" or "comprises" is open-ended, and includes one or more stated elements, steps and/or functions without precluding one or more unstated elements, steps and/or functions.

The present invention is described below with reference to block diagrams and/or operational illustrations of methods and wireless receivers according to embodiments of the invention. It is understood that each block of the block diagrams and/or operational illustrations, and combinations of blocks in the block diagrams and/or operational illustrations, can be implemented by radio frequency, analog and/or digital hardware, and/or computer program operations. These computer program instructions may be provided to a processor of a general purpose computer, special purpose computer, ASIC, and/or other programmable data processing apparatus in a wireless terminal or base station, such that the instructions, which execute via the processor of the computer and/or other programmable data processing apparatus, create means for implementing the functions/acts specified in the block diagrams and/or operational block or blocks. In some alternate implementations, the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Although embodiments of the present invention are discussed in the context of modulating certain waveforms, it is to be understood that the present invention is not limited to use with any particular waveforms. For example, an arbitrary modulation waveform is a noise-like waveform, which may, for example, arise in code-division multiple access (CDMA) systems where many differently-coded signals are added and amplified by the same transmit power amplifier. The sum of many independent signals tends to acquire Gaussian noise-like statistical characteristics, according to a Central Limit Theorem. A complex Gaussian noise signal has a distribution which is Gaussian in two dimensions; its phase distribution is uniform around 360 degrees, and its amplitude (radius) distribution is a Rayleigh distribution. Because a Rayleigh distribution has an unlimited peak value, it can be advantageous to limit the peak value by clipping the signal before amplification, at, for example, its 2 or 3-sigma limit, and then bandpass filtering the clipped signal to remove the clipping products. Bandpass filtering re-introduces some of the clipped amplitude variations, but the resultant signal is a bandlimited signal with substantially lower, and thereby bounded, peak amplitude that is suitable for amplification.

Figure 2:
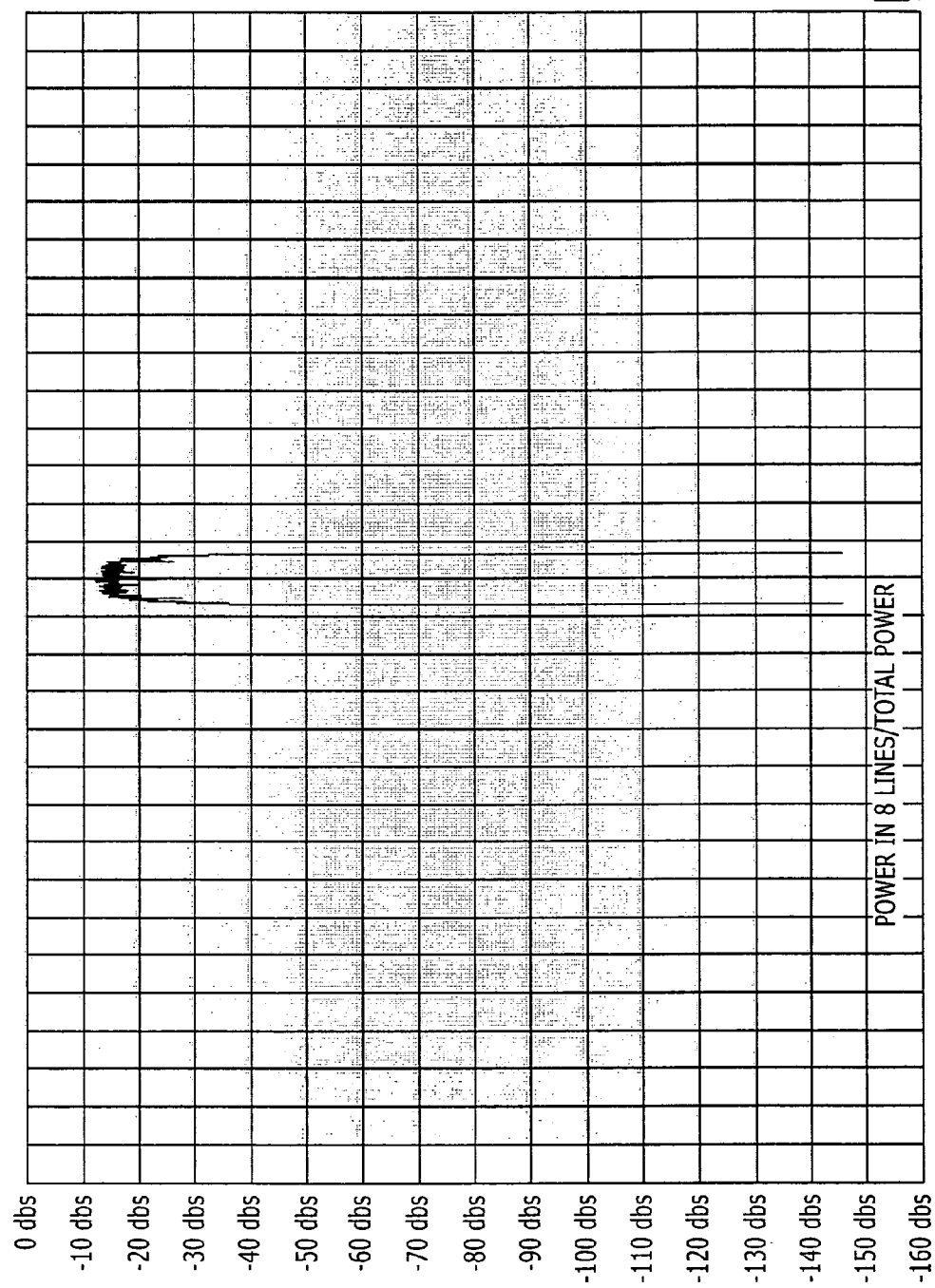
FIG. 2 illustrates the output spectrum of a RRC-QPSK signal from an ideal linear transmitter.

Embodiments of the present invention may also be used to modulate a root-raised-cosine-filtered quadrature-phase-shift keyed signal (RRC-QPSK). Such signals can be represented by the trajectory of their complex (in phase I, quadrature Q) or polar (amplitude R, phase THETA) vectors versus time in the complex plane. FIG. 1 illustrates exemplary trajectories of a root-raised-cosine filtered QPSK signal, such as that used in Universal Mobile Telecommunications System (UMTS) 3rd generation wireless systems. The ideal spectrum of this signal is shown in FIG. 2. The ideal spectrum is perfectly bandlimited and contained within its allocated channel.

Figure 3:
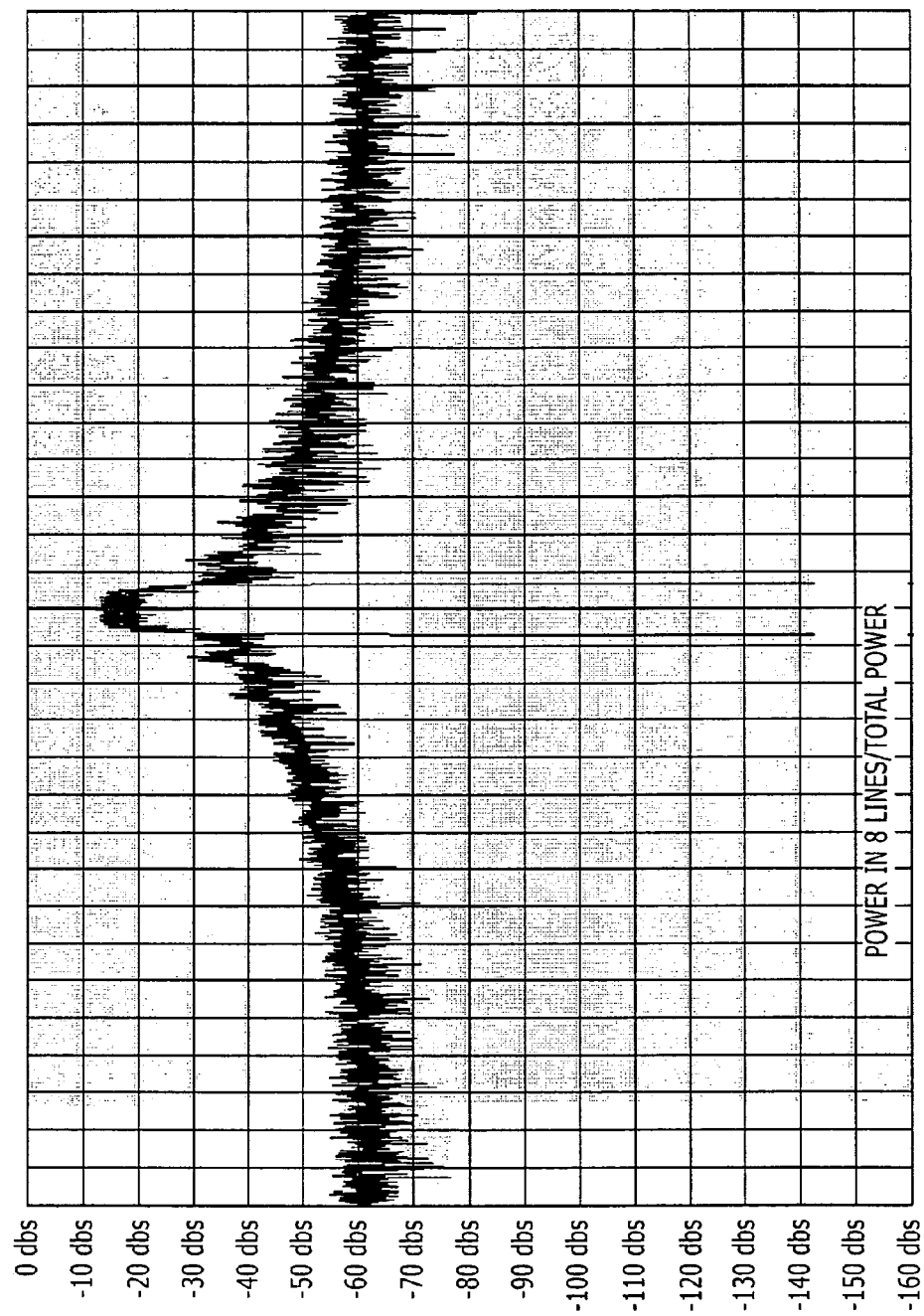
FIG. 3 illustrates the output spectrum of a RRC-QPSK signal with amplitude variations removed (i.e. hardlimited).
Figure 4:
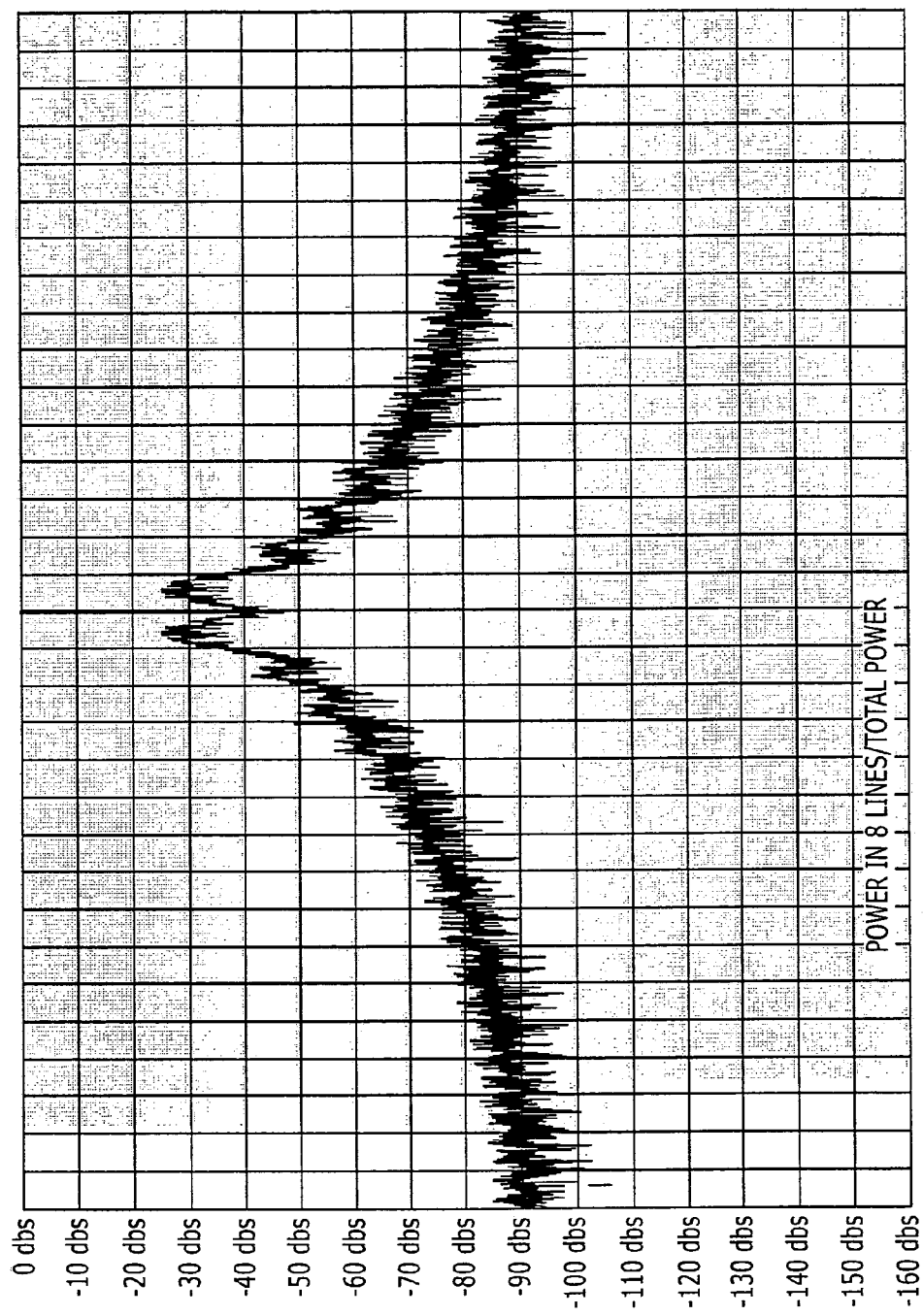
FIG. 4 illustrates the amplitude spectrum of a RRC-QPSK signal.

FIG. 3 shows the spectrum of a constant-amplitude (hard-limited) I and Q signal, hereinafter called the "phase signal", which is obtained by normalizing all I and Q values to unit length by dividing them by their own amplitudes as provided by the square root of the sum of their squares (i.e., square root of $I^2+Q^2$). The spectrum of this amplitude waveform is shown in FIG. 4.

Figure 5:
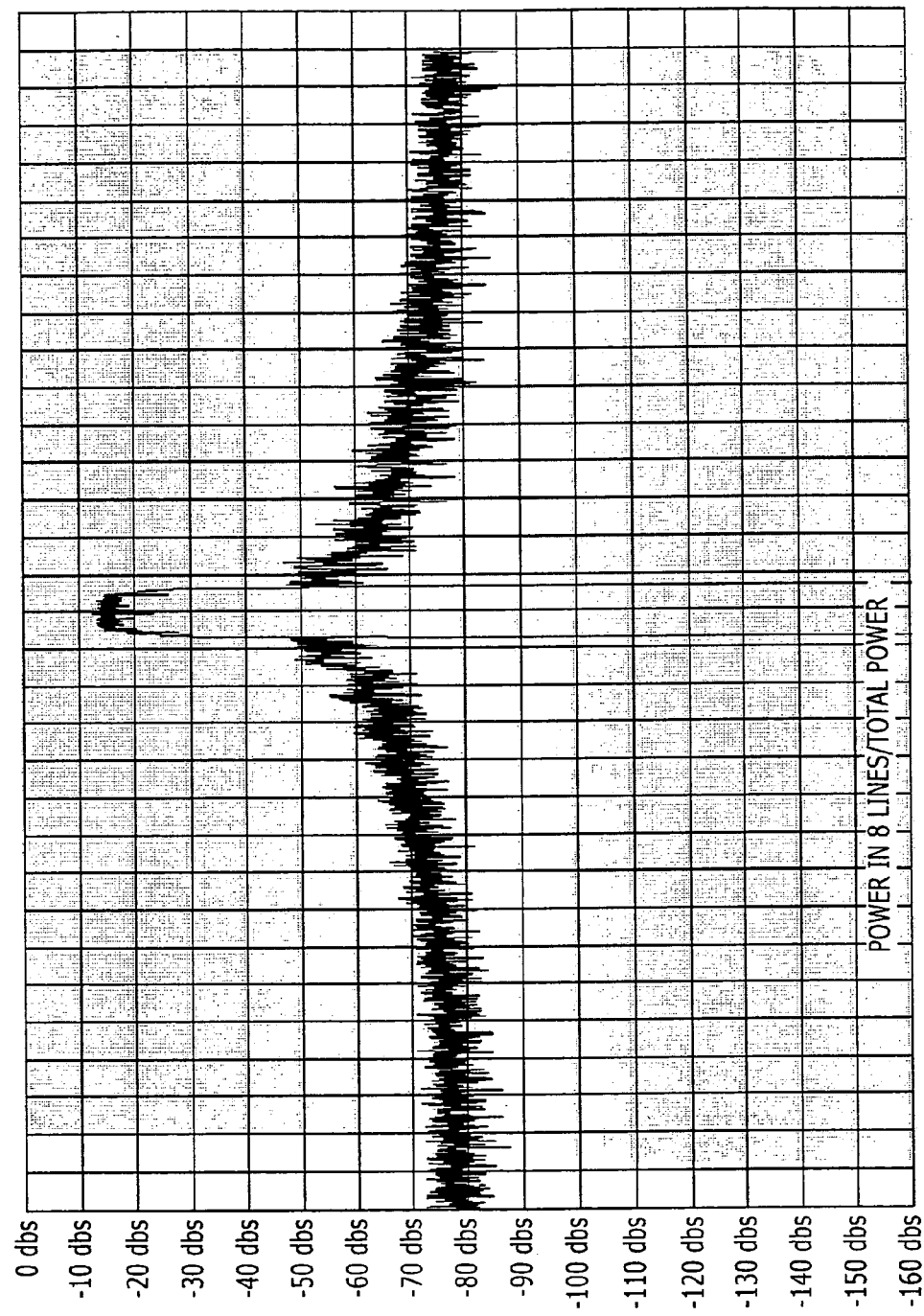
FIG. 5 illustrates the output spectrum after re-applying an amplitude signal to the hardlimited signal with a relative time delay of 1/32 of the symbol rate.

When the amplitude signal and the phase signal are multiplied, the original bandlimited I and Q signal is restored to have the original spectrum of FIG. 1 according to ideal operations. However, various practical limitations can prejudice the restoration of a perfectly bandlimited spectrum signal. One such practical source of error is a relative time delay that can occur between the amplitude and the phase signal. FIG. 5 illustrates the restored spectrum when there is a relative timing error of only 3% of the QPSK symbol period. As shown in FIG. 5, re-multiplication of the phase signal with the amplitude signal only suppressed the far-out spectral tails by 10 dB because of delay error.

Figure 6:
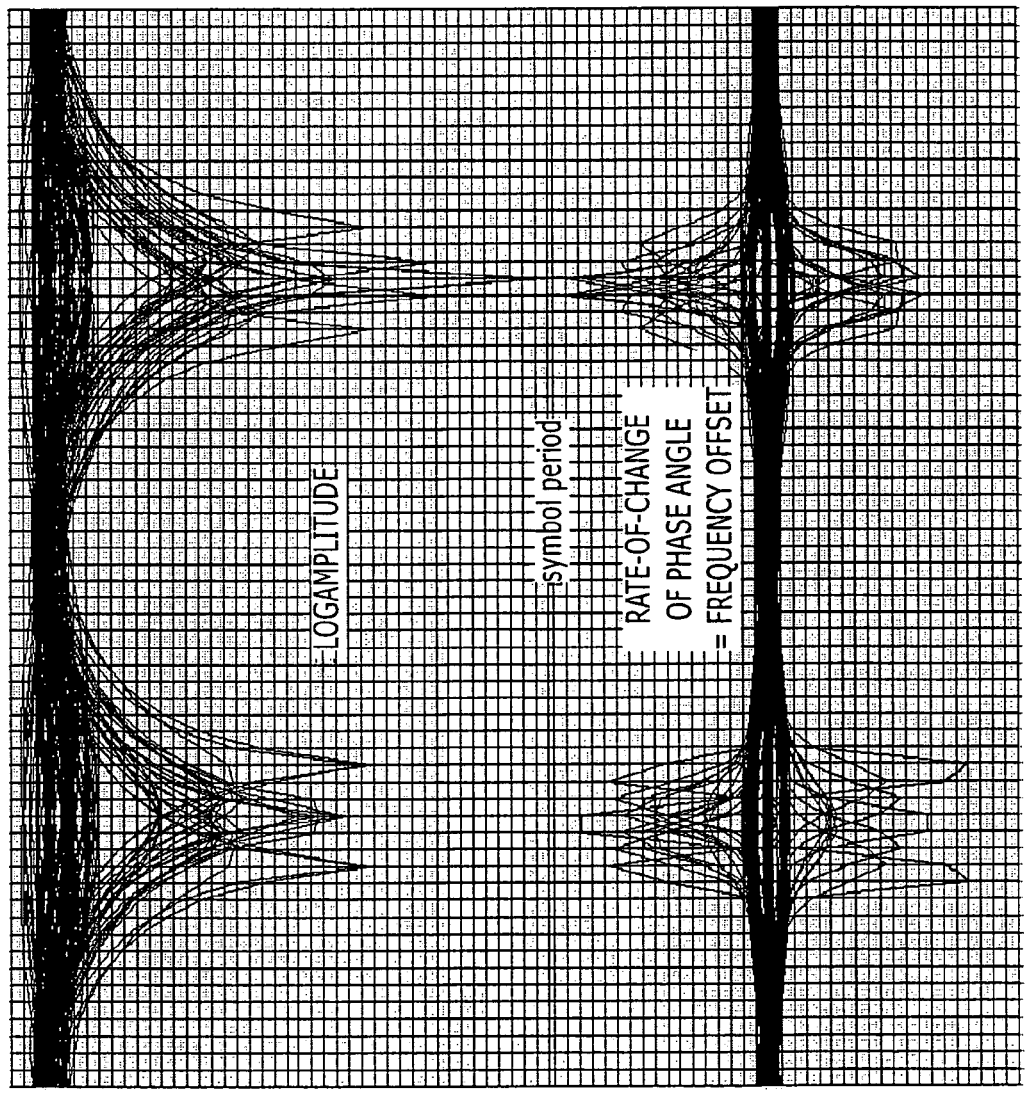
FIG. 6 illustrates the correlation between log amplitude and rate-of-change-of-phase angle (frequency offset), respectively, over symbol period intervals.

The high sensitivity of spectrum variation due to delay error can be understood by examining the amplitude signal and the phase signal waveforms. For example, because the illustrated spectral plot is on a dB/frequency-offset scale, it can be helpful to examine the amplitude waveform on a logarithmic (decibel) scale together with examining the rate-of-change of phase, which is a measure of instantaneous frequency deviation, as shown in FIG. 6. The waveforms of FIG. 6 are synchronised to the symbol period, which shows that sharp amplitude dips occur during transitions from one symbol to another and correspond to a high rate-of-change of phase. These high-bandwidth events are most pronounced during transitions between diametrically opposite symbols, where, for example, an I,Q trajectory passes close to or through the origin. A trajectory through the origin involves an instantaneous 180 degree phase flip accompanied by a zero amplitude. Because the amplitude is zero at the exact instant of the phase flip, the deleterious effect of these events on spectral containment is limited. However, a small time delay mismatch between the amplitude and the phase signal results in the high-bandwidth phase events not being synchronised to zero or low amplitude, and can result in degraded spectral containment.

Spectral containment may also be degraded because of band-limitations imposed on the amplitude (A) and phase (Phi) of signals. When an I,Q signal exists in a sampled numerical domain, and is converted sample by sample to amplitude and phase through a Cartesian to Polar conversion by, for example, the equations $Ai = \text{root}(I_i^2 + Q_i^2)$ and $Phi(i) = \text{ARCTAN}(Q_i, I_i)$, the computed samples of phase and amplitude are then converted to continuous waveforms by a smoothing interpolation filter. The filter cuts off the signal at or below the Nyquist rate of half the sample rate. The bandwidth of each signal is thus restricted to half the sample rate or lower. The amount of oversampling that can be employed may be practically limited to a few times the symbol rate, for example 4, 8 or 16, and accordingly the bandwidth of the amplitude and phase signals will be limited to 2, 4 or 8 times the symbol rate. Because a low pass filter effectively forms a weighted addition of successive samples to compute an output sample, a filter may not be directly applied to the phase angle, and phase angles cannot be added in this manner due to modulo-2Pi issues. Instead, the rate-of-change of phase may be limited by, for example, applying successive phase samples to a phase-lock-loop having a limited bandwidth. Alternatively, the phase may be transitioned from its current filter output value in the direction of the next target sample value in a smooth manner according to a mathematical formula or algorithm. For transitions close to the origin, there may be ambiguity about whether the phase should be rotated clockwise or anticlockwise between successive samples. The dilemma in attempting to define optimum amplitude and phase waveforms is that, if one waits before rotating the phase until the amplitude is near a minimum, then the phase must be rotated faster in a shorter available remaining time. Consequently, there can be a 9 dB improvement in the spectral tails for each doubling of the modulation bandwidth. Band limiting the amplitude waveform can conversely degrade the spectral tails.

Figure 7:
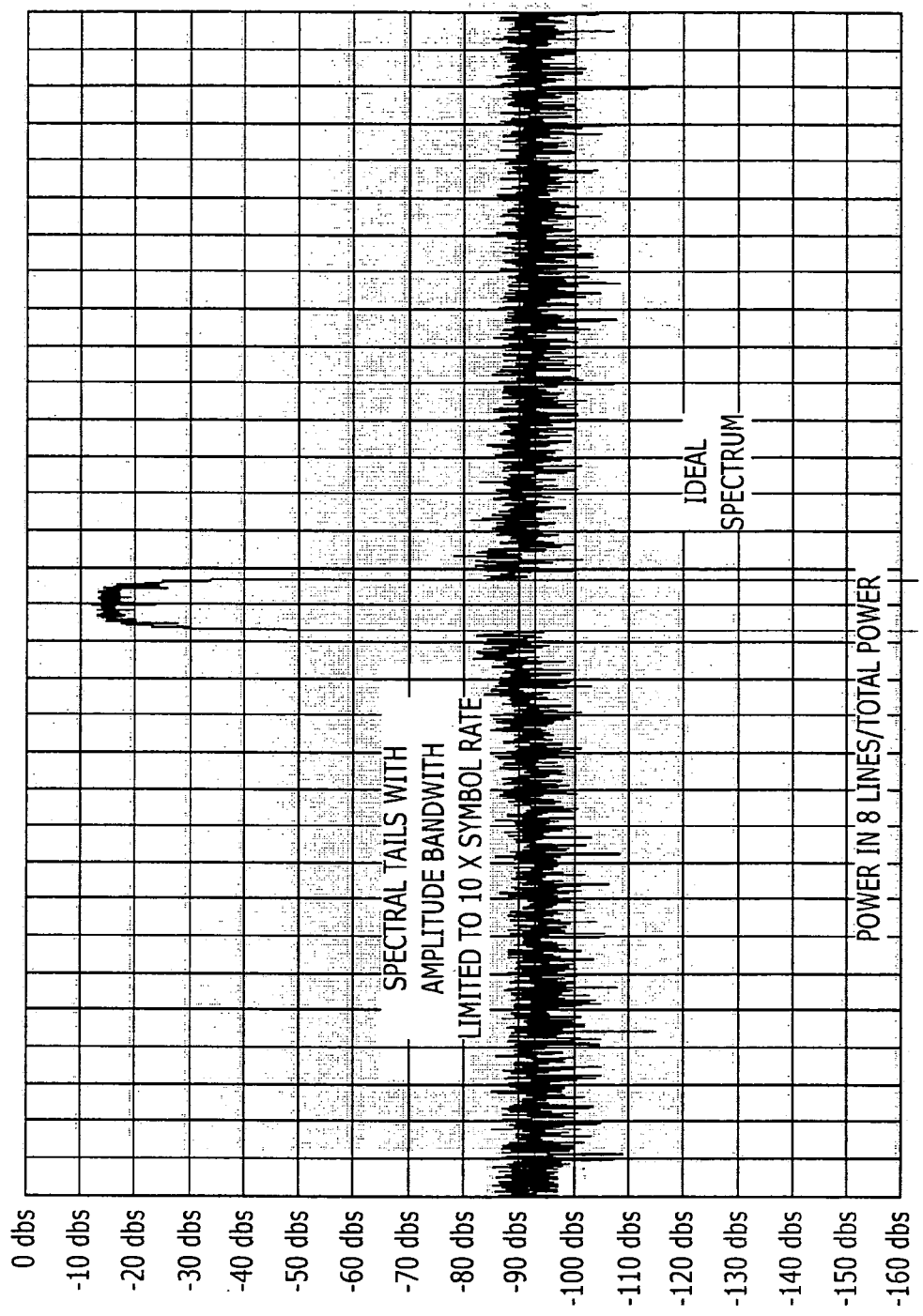
FIG. 7 illustrates the effect of bandlimiting the amplitude signal before amplitude remodulation on the spectral tails of an output signal.
Figure 8:
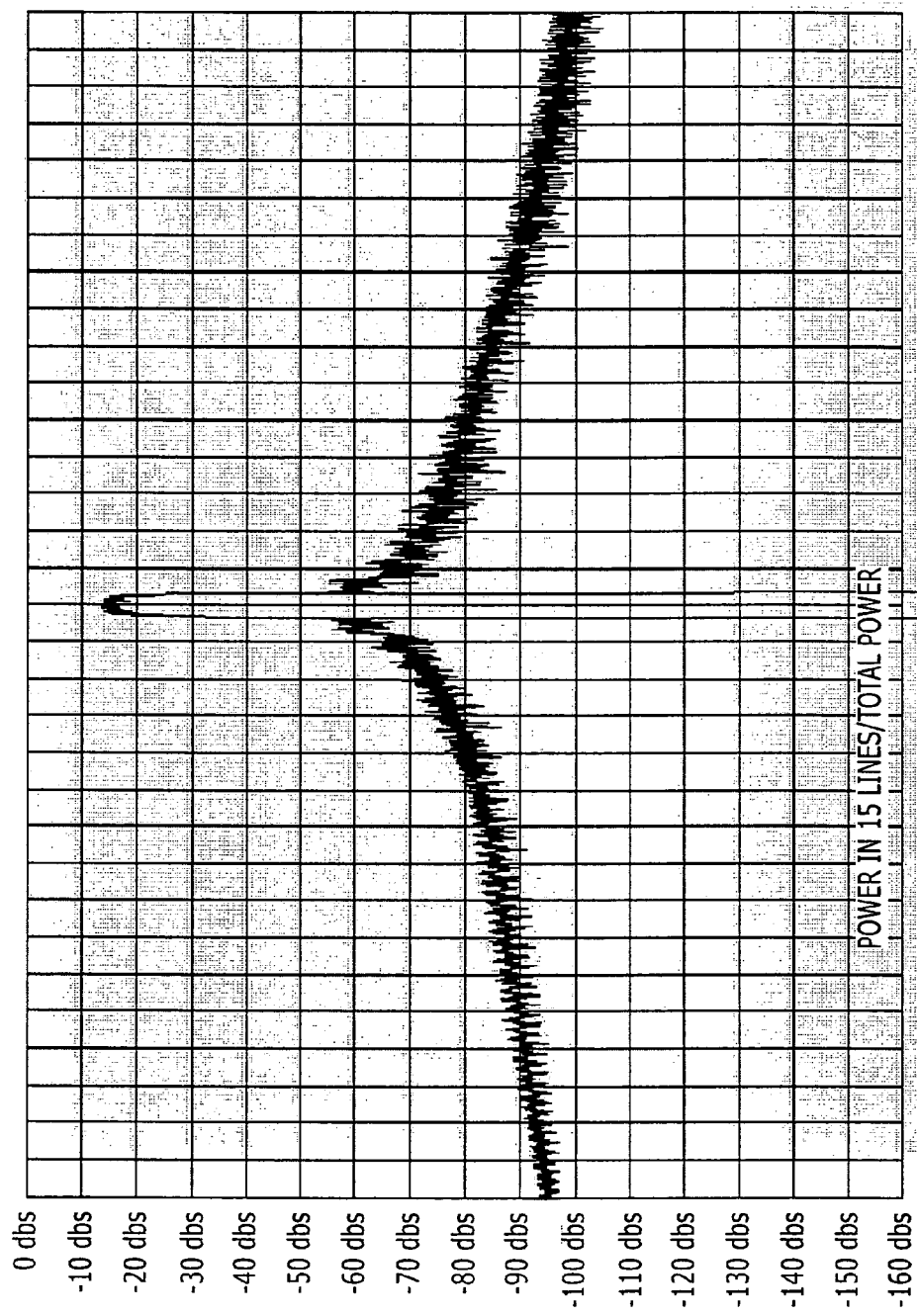
FIG. 8 illustrates the effect of bandlimiting the amplitude signal and filtering the phase signal with a phase-lock-loop on the spectral tails of an output signal.

FIG. 7 illustrates the effect of bandlimiting the amplitude on the spectrum, when the phase signal is not bandlimited. A Gaussian bandlimiting filter is used having a −3 dB point equal to 10 times the QPSK symbol rate. FIG. 8 illustrates the effect on spectrum of bandlimiting the amplitude to 10 times the symbol rate and filtering the phase using a phase lock loop having a natural frequency of 10 times the symbol rate. As illustrated, both effects cause a departure from the ideal band limited spectrum, leaving energy in the far-out tails.

Various embodiments of the present invention may reduce energy in the spectral tails by generating a phase signal that is not completely hardlimited, and which has some amplitude variation remaining. For example, the amplitude of the phase signal is permitted to decrease when, for example, a high rate of change of phase occurs. To compensate for the incompletely hardlimited phase signal, the amplitude signal is modified such that, in some embodiments, the product of the modified amplitude signal and the incompletely hardlimited phase signal is equal to the desired complex modulated signal. These embodiments can include using a transmit amplifier to amplify the phase signal, where the amplifier is amplitude modulated by the modified amplitude signal and so that the amplitude and phase signals are multiplied. In some other embodiments, amplifier deviation from an ideal multiplier may be compensated by pre-modification of the amplitude modulating signal so as to provide an accurate reconstruction of the desired complex-modulated signal at the output of the amplifier.

An incompletely hardlimited phase signal and a modified amplitude signal may be derived using the following equations:

$A(t) = \text{square root of } (I^2(t) + Q^2(t) + C)$; and $(I'(t), Q'(t)) = (I(t), Q(t))/A(t)$ where I and Q are the in-phase (real) and quadrature (imaginary) waveform parts of the complex signal modulation, A(t) is the modified amplitude waveform, and I' and Q' are the incompletely hardlimited phase signal components. C is a constant equal to a fraction of the peak amplitude. If C is, for example, 0.01, the modified amplitude A(t) may not fall below −20 dB.

Figure 9:
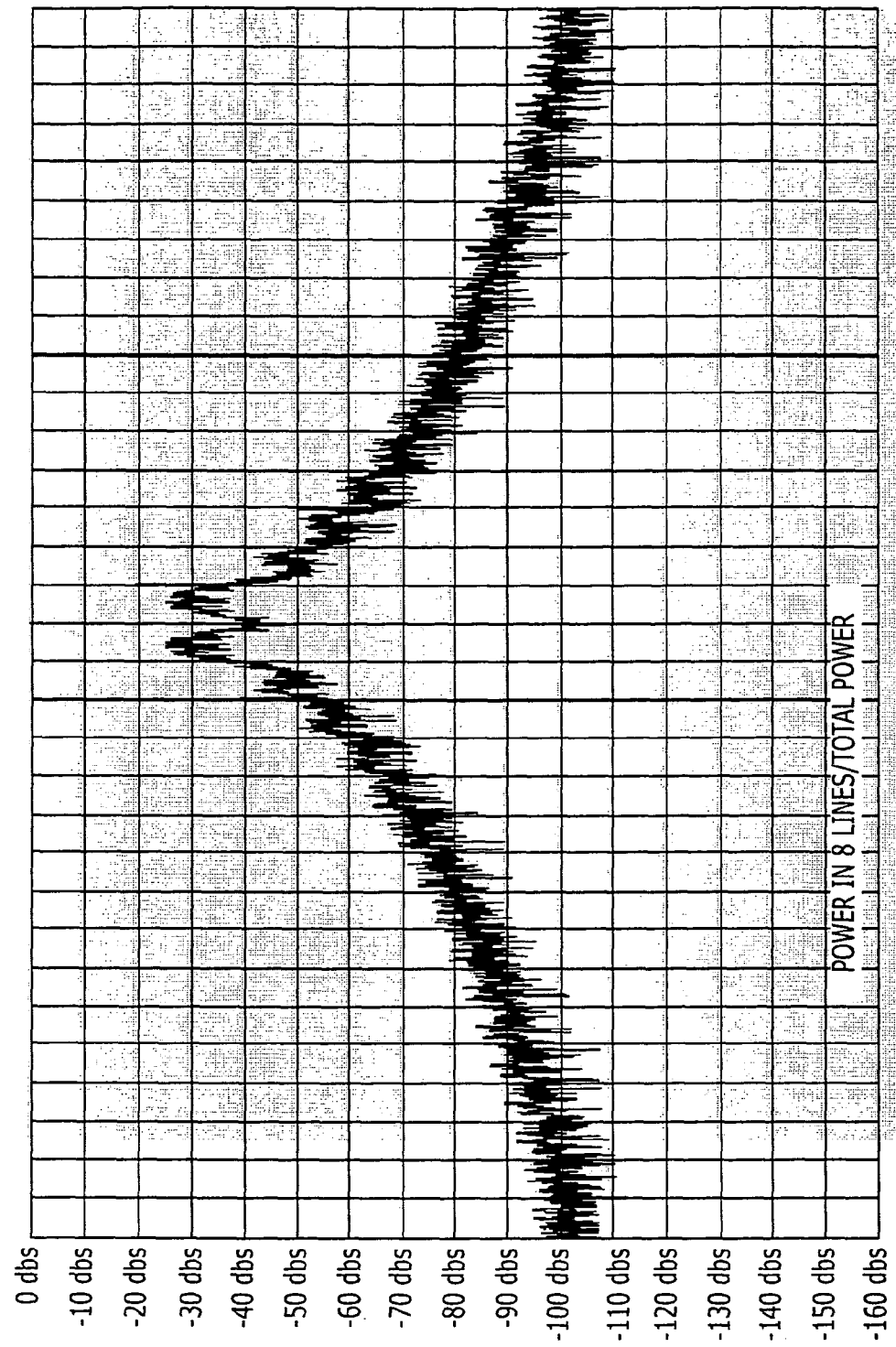
FIG. 9 illustrates the spectrum of a modified amplitude signal generated by the square root of the sum of the squares of I and Q plus a constant C of 0.01.

FIG. 9 shows the spectrum of the amplitude signal when C is equal to 0.01. By comparing FIG. 9 with the unmodified amplitude spectrum of FIG. 4, it may be seen that the spectral tails are about 10 dB lower. Raising the value of C can further reduce the spectral tails. A 10 dB reduction in spectral tails is also seen in the phase signal spectrum of the modified phase signal when compared to the spectrum of the unmodified phase signal spectrum of FIG. 3.

Figure 10:
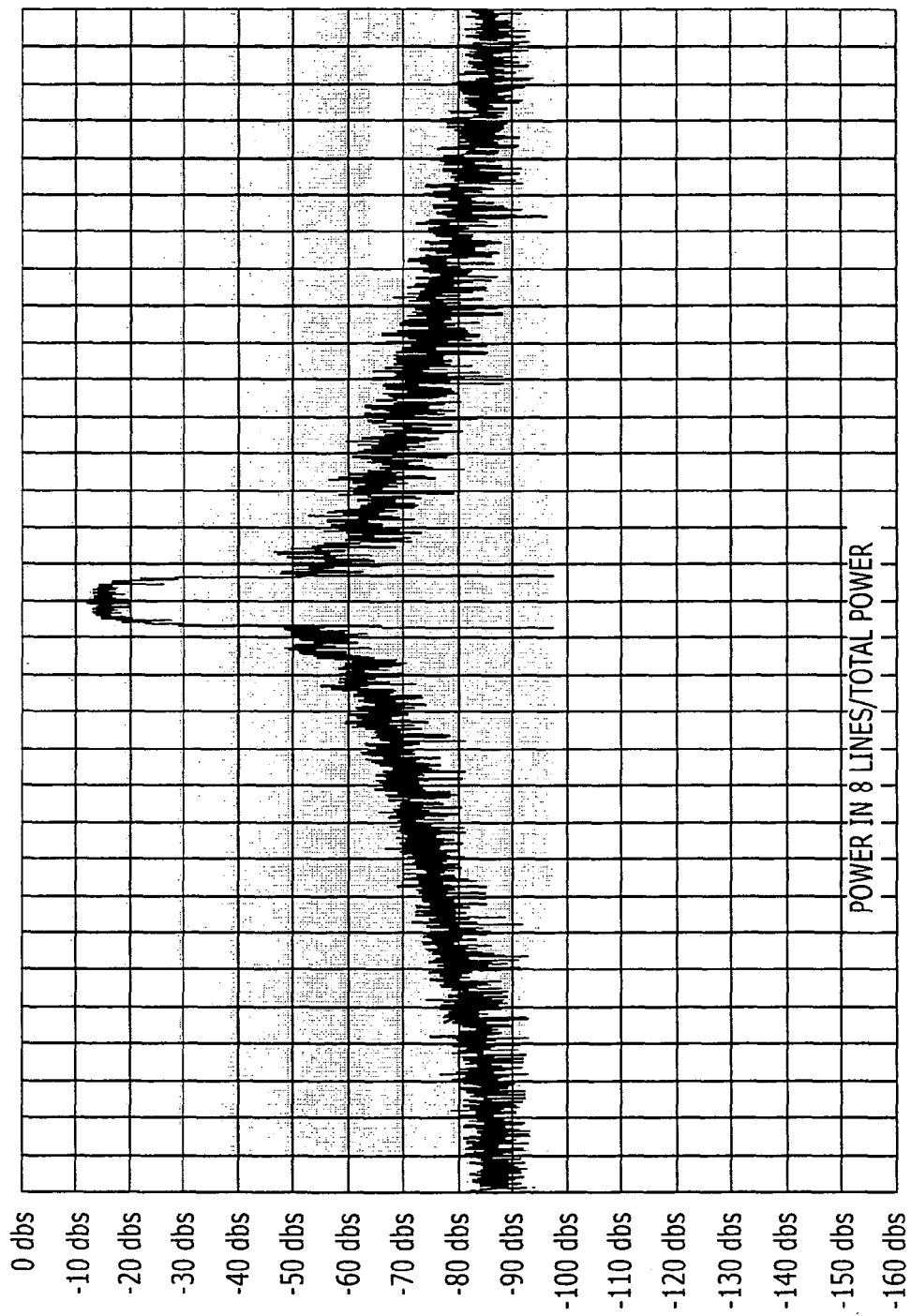
FIG. 10 illustrates the spectrum of an output signal reconstructed by multiplying a modified amplitude signal by a modified phase signal having a delay error of 3% of the symbol period.

The 10 dB reduction in the spectral tails of the amplitude and phase signals can carry through to the output signal that is obtained by remultiplying the amplitude with the phase signal when there is a delay error between the amplitude and phase signals of, for example, ½2nd of the symbol period, as compared with the previously illustrated restored spectrum that is shown in FIG. 5. FIG. 10 illustrates a restored spectrum of a reconstructed signal that may be obtained according to various embodiments of the present invention by multiplying a modified amplitude signal by correspondingly modified phase signals, with a delay error of 3% of the symbol period.

Figure 11:
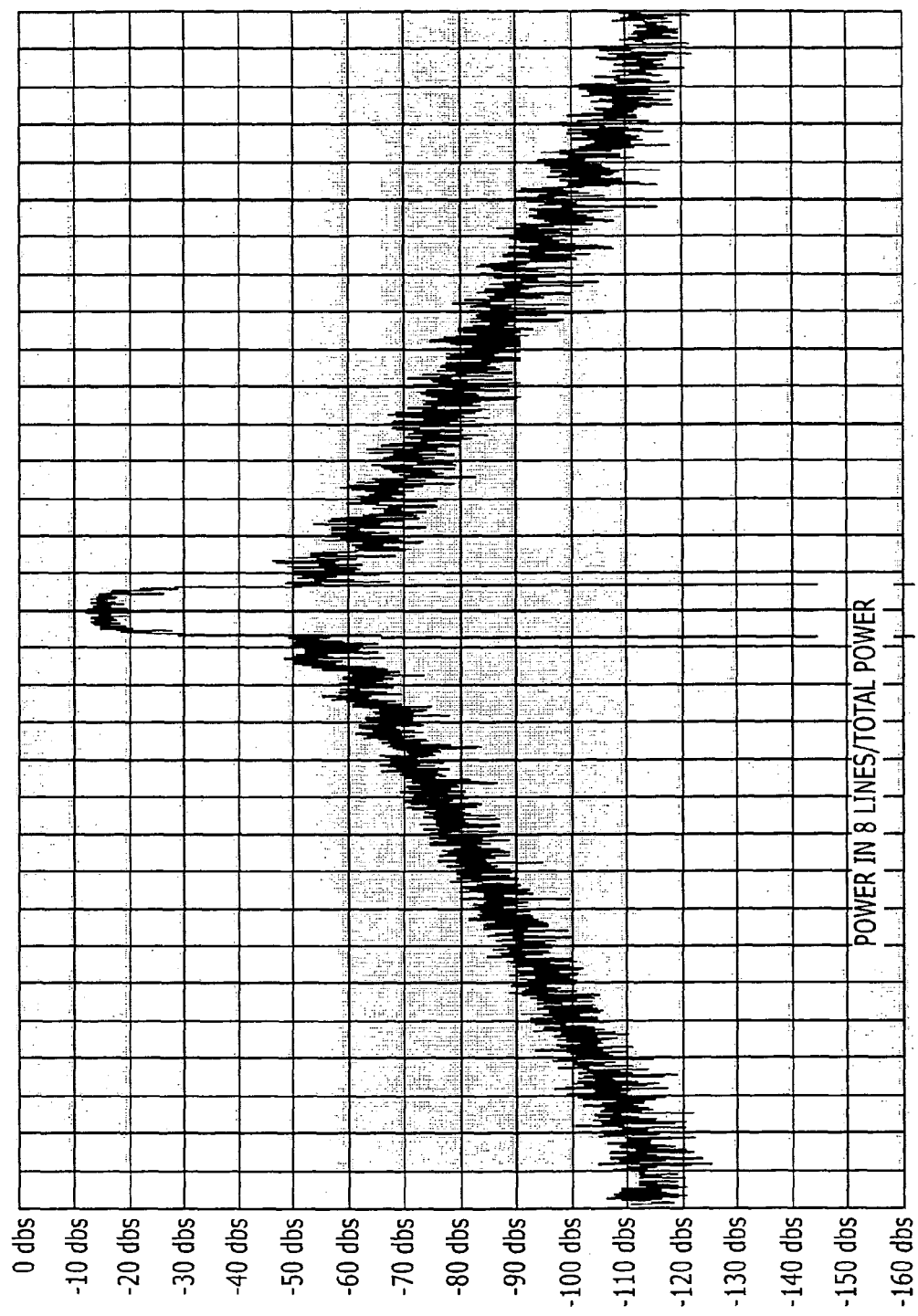
FIG. 11 illustrates the spectrum of an output signal generated with the constant C=0.1.

Greater reduction in the spectral tails can be obtained using higher values of the constant C, such as, for example, as shown in FIG. 11 for a C equal to 0.1. Consequently, by modifying the amplitude and phase signals so that a portion of the amplitude variation is retained in the phase signal, and so that the amplitude variation lies below a threshold relative to the peak amplitude, a reduction in the sensitivity of the signal spectrum to delay errors between the amplitude and phase signal may be obtained.

Figure 12:
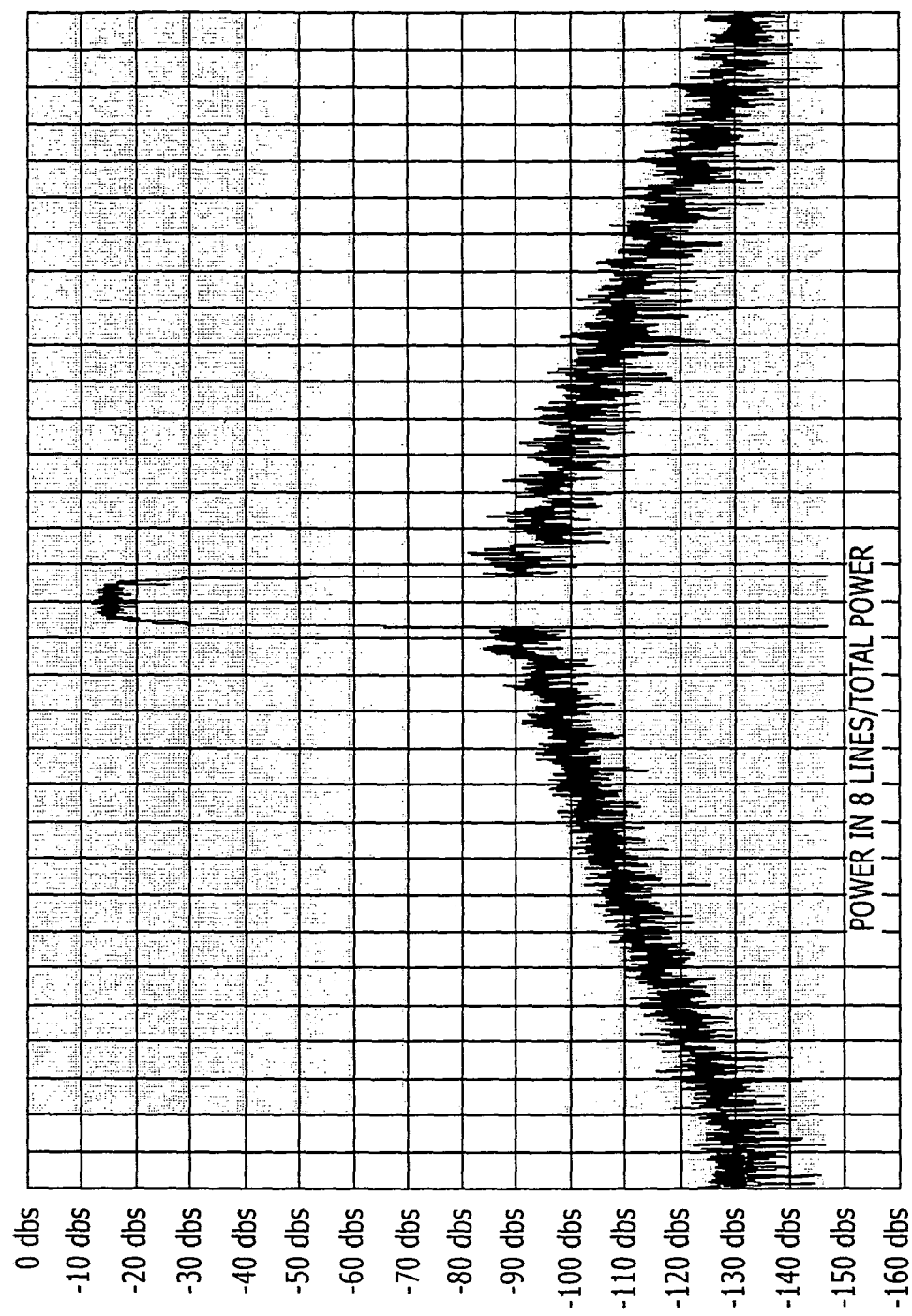
FIG. 12 illustrates the spectrum of an output signal generated with the constant C=0.01 and the amplitude remodulation bandwidth limited to 10 times the symbol rate.
Figure 13:
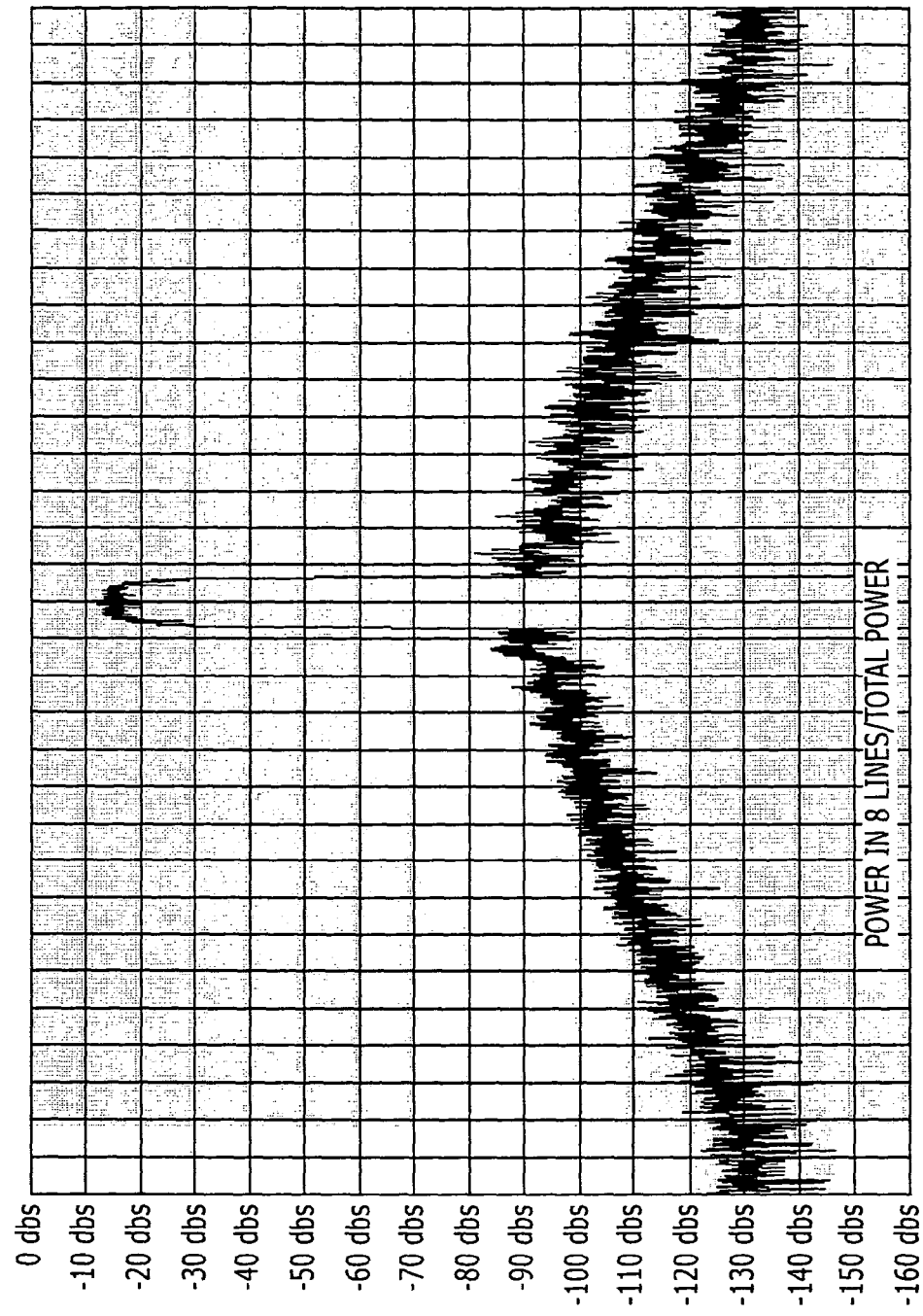
FIG. 13 illustrates the spectrum of an output signal generated with the constant C=0.1 and the amplitude bandlimited to 10 times the symbol rate.

Various embodiments of the present invention may also reduce the sensitivity of signal spectrum to a bandwidth limitation of the amplitude remodulation signal. A reduction in signal spectrum sensitivity can be seen, for example, in FIG. 12 for various embodiments of the present invention using C equal to 0.01, and in FIG. 13 using C equal to 0.1 and the same amplitude bandwidth restriction to 10 times the QPSK symbol rate, as compared to the spectral tails shown in FIG. 7.

Figure 14:
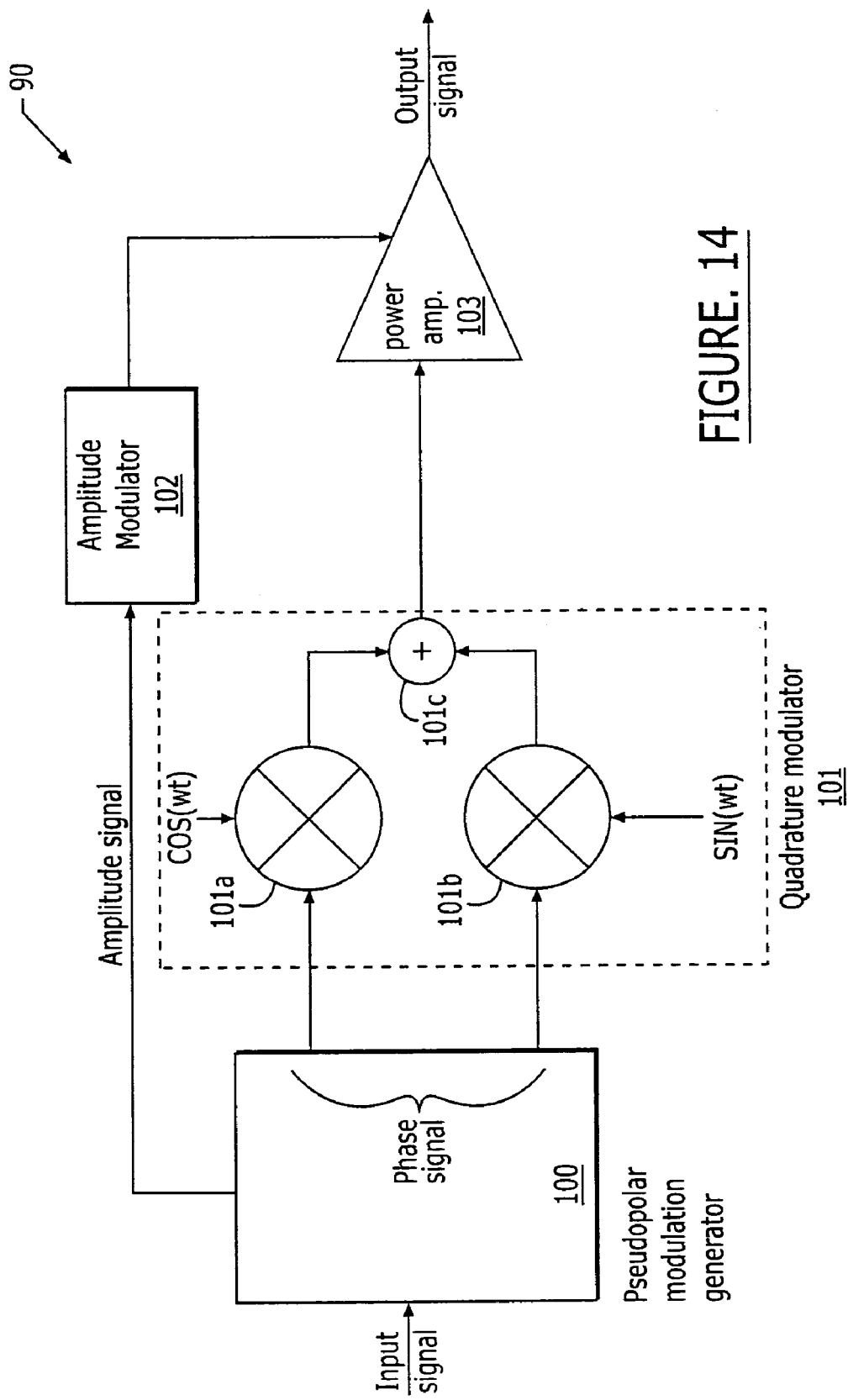
FIG. 14 is a block diagram of a radio transmitter according to some embodiments of the present invention.

FIG. 14 shows a block diagram of a radio transmitter 90 according to some embodiments of the present invention. The radio transmitter 90 includes a pseudopolar modulation generator 100, a quadrature modulator 101, an amplitude modulator 102, and a power amplifier 103. An input signal that is to be modulated by a radio carrier frequency signal is applied to the pseudopolar modulation generator 100. The pseudopolar modulation generator 100 generates a complex phase signal having a real part I'(t) and an imaginary part Q'(t) and an amplitude modulating signal A'(t) based on the input signal. The complex phase signal I'(t) and Q'(t) is provided to the quadrature modulator 101 where it is modulated with a radio carrier frequency signal Cos(wt) and Sin(wt). The modulated complex phase signal is amplified by the power amplifier 103, based on an amplitude modulation signal from the amplitude modulator 102, to generate an output signal. The amplitude modulator 102 generates the amplitude modulation signal for the power amplifier 103 based on the amplitude modulating signal A'(t) from the pseudopolar modulation generator 100.

Example types of input signal and corresponding output signals include, but are not limited to, the following:

1. The input signal may be an analog speech signal, and the output signal may be a single-sideband signal.
2. The input signal may be a digital data stream, and the output signal may be a digitally modulated radio signal using Root-Raised-Cosine filtered Quadrature Phase Shift Keying.
3. The input signal may be a complex (I,Q) signal which is to be converted to pseudopolar components I'(t), Q'(t), and A'(t) so that the output of the power amplifier is an amplified version of the input signal modulated onto a radio frequency carrier.
4. The input signal and the pseudopolar signals A'(t), I'(t), and Q'(t) may be continuous time waveforms or may be discrete-time, sampled waveform values. Discrete-time values may be smoothed by one or more smoothing filters in quadrature modulator 101 and/or amplitude modulator 102, which may interpolate the discrete time samples to produce continuous time waveforms.

The pseudopolar modulation generator 100 may, for example, perform digital processing, such as digital signal processing, to process numerical signal samples of the A'(t), I'(t) and Q'(t) signals, which may then be converted to continuous time signals using digital-to-analog (DtoA) converters and low-pass smoothing filters. The pseudopolar modulation generator 100 converts the input signal to I and Q modulation signals, if not already in that form, and then converts the I and Q signals to the phase signals I'(t) and Q'(t) and the amplitude signal A'(t) using, for example, the equations:

$$A^2(t) = I_2(t) + Q^2(t),$$

$$A'(t) = \text{Square root of } (A^2(t) + C),$$

$$I'(t) = I(t)A'(t), \text{ and}$$

$$Q'(t) = Q(t)/A'(t).$$

Using these equations, the I'(t) and Q'(t) signals retain the same phase angle as the original I(t) and Q(t) signal but have a reduced amplitude variation. If C is 0, the amplitude variation is zero and the input signals have the same amplitude as the I'(t) and Q'(t) signals. The output signals A'(t), I'(t) and Q'(t) may be modified to compensate for distortion that may be later introduced by, for example, the power amplifier 103 and/or the amplitude modulator 102. For example, the phase angle of the input signal may be modified based on the unmodified amplitude signal A(t) and/or the modified amplitude signal A'(t) to compensate for AM/PM conversion distortion in the power amplifier 103. Similarly, the amplitude of the phase signal may also be modified to compensate for amplitude distortion in the power amplifier 103, and the signal A'(t) may be modified to compensate for non-linearity of the amplitude modulator 102.

The quadrature modulator uses a balanced modulator 101a to modulate the I'(t) signal by multiplying it by a cosine signal waveform at the radio carrier frequency. Another balanced modulator 101b modulates the Q'(t) signal by multiplying it by a sine signal waveform at the radio carrier frequency. The modulated I'(t) and Q'(t) signals are then added by an adder 101c to generate the complex modulated drive signal that is provided to the power amplifier 103.

As was previously explained, the amplitude modulation signal A'(t) is applied via the amplitude modulator 102 to the power amplifier 103. The amplitude modulator 102 may be a high-level modulator that modulates a supply voltage to the power amplifier 103 and, thereby, peak power output capability of the power amplifier 103. Modulating the supply voltage of the power amplifier 103 may cause the power amplifier 103 to more accurately reproduce the amplitude variations of the complex modulated drive signal even when it is impedance mismatched to devices that receive its output signal. Such high-level modulation of the supply voltage may be performed using a switching-type regulator. However, switching regulators are bandwidth limited due to filtering used to remove affects of the switching components in order to avoid their degrading the output signal spectrum.

Figure 15:
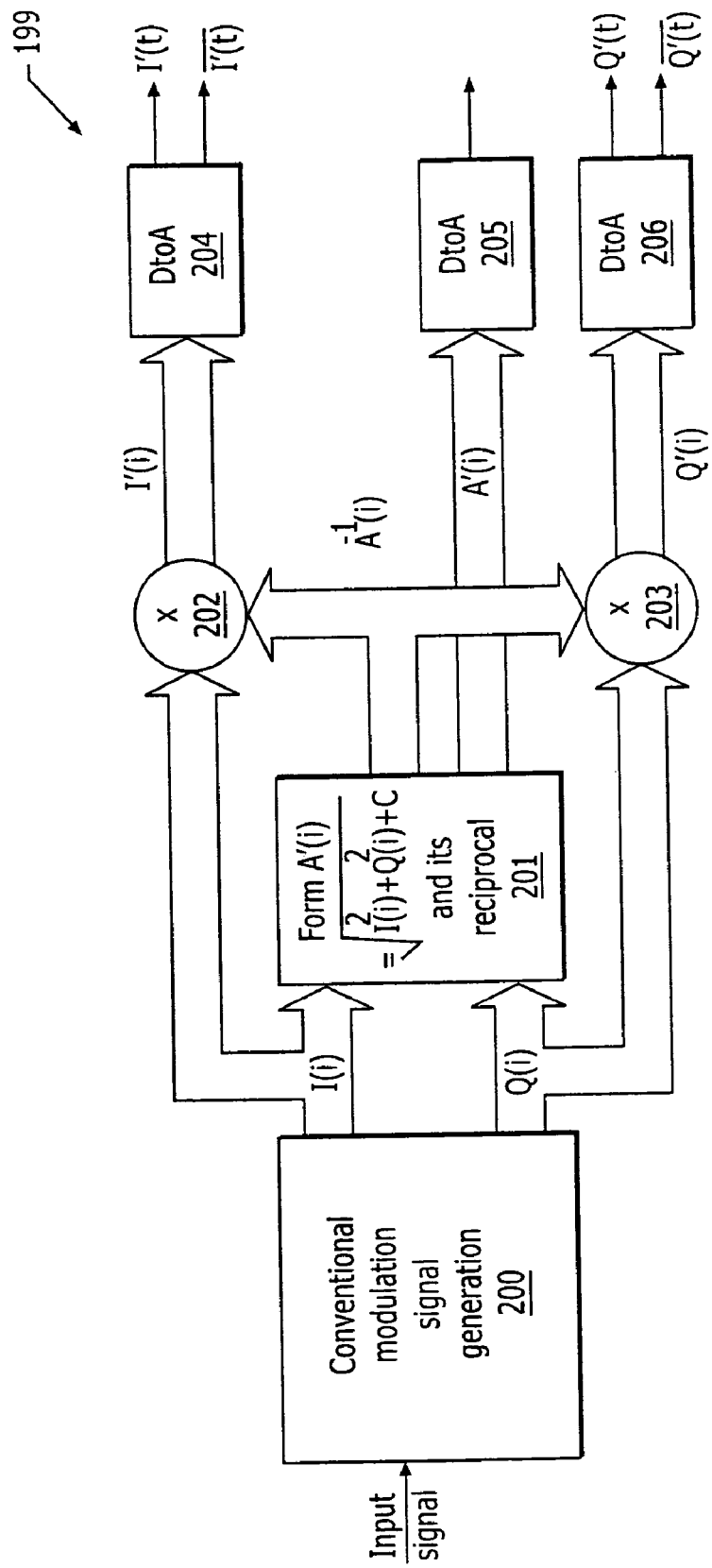
FIG. 15 is a block diagram of a pseudopolar modulation generator according to some embodiments of the present invention.

FIG. 15 shows a pseudopolar modulation generator 199 that uses digital signal processing. Although separate blocks are illustrated in FIG. 15, these blocks may be performed by, for example, program code that is executed by a digital signal processor, microprocessor, application specific interface circuit, look-up tables, and/or other processing device. For example, a processor based on logarithmic arithmetic, such as that described in U.S. Pat. No. 5,944,774, which is incorporated herein by reference, may be used to perform one or more of the operations described below. A modulation signal generator 200 converts the input signal to sampled complex values I(i) and Q(i), where such conversion may be performed in a conventional manner. Calculation block 201 generates amplitude values A'(i) and their reciprocal values 1/A'(i). The amplitude values A'(i) may be generated by the following equation:

A'(i)=square root of $(I^2(i)+Q^2(i)+C)$

I'(i) and Q'(i) values are then formed by multiplying the sampled complex values I(i) and Q(i) by the reciprocal amplitude values $A^{-1}$(i) using multipliers 202 and 203, respectively. The values for A'(i), I'(i) and Q'(i) are provided to digital-to-analog (DtoA) converters 205, 204 and 206 respectively. The digital-to-analog converters 204, 205 and 206 and/or subsequent low-pass smoothing filters that filter their output may be constructed, for example, as described in one or more of the following U.S. Pat. Nos.: 6,429,798; 5,867,537; 5,629,655; and 5,530,722, all of which are hereby incorporated by reference herein.

The spectral tails are reduced by allowing some amplitude variation to remain in the phase signal, rather than using a constant envelope phase signal as in conventional polar modulation. For example, with reference to FIGS. 14 and 15, the I and Q values are soft-limited by dividing them by a value derived from their own amplitude, but prevent from going to zero when their amplitude goes to zero. Preventing the amplitude from becoming zero also avoids numerical computational difficulties (e.g., divide by zero register overflow).

Other methods of allowing partial amplitude variation to remain in the phase signal may include, for example, generating a constant envelope phase signal using a voltage controlled oscillator and a phase modulated phase-lock-loop, and then partially amplitude modulating the signal using a low-level amplitude modulator and providing the amplitude modulated signal to the power amplifier 103. The low-level amplitude modulator may be less prone to bandwidth restrictions and relative delay than the high-level amplitude modulator 102. A low-level amplitude modulator may include, for example, half of a balanced modulator that can provide unipolar (i.e., zero to positive values) amplitude modulation. By leaving part of the amplitude variation attached to the phase signal, and, in particular, part of the amplitude dynamic range associated with the amplitude troughs, spectral tails may not be degraded as much by delay errors between the phase signal and the high-level amplitude modulating signal.

When the power amplifier 103 is not linear, but instead is characterized by a saturation curve that relates its output signal to its input signal, then its response to amplitude modulation may be distorted. The effect of power amplifier saturation on the performance of the transmitter according to some embodiments of the present invention is shown in FIGS. 17–20, and will be discussed below after the following description of the exemplary power amplifier saturation model.

A power amplifier intermodulation simulated via a distortion model. When the distortion model is to be used to develop anti-distortion measures, such as predistortion compensation techniques, then the model may include both AM-AM and AM-PM distortion modeling. However, when the model is to be used only to obtain a knowledge of how the spectral tails are affects by varying back-off, it can be sufficient to use only an AM-AM distortion model. Consequently, for purposes of illustration only, a distortion model has been used that assumes that the I,Q input signal is represented by complex input waveform values, and that the complex output waveform is defined by the following equation:

$$\text{Output\_Signal} = \frac{(I, Q)}{\left(1 + \left[\frac{|I, Q|}{V_{sat}}\right]^a\right)^{1/a}} \qquad \text{(Equation 1)}$$

where Vsat is the saturated output voltage. According to this equation, the phase of the I,Q input signal is unchanged (i.e., no AM-PM distortion), while the amplitude is asymptotically compressed (reduced) to a maximum of Vsat. A low value for "a" such as, for example, 2 or 3 can provide a gradual onset of distortion that starts long before Vsat is reached, while a high value for "a" such as, for example, 6 or 12 can provide a substantially linear amplification until saturation is reached and the output signal then abruptly changes to being clipped. The value "a" can also be related to the amplitude compression that is obtained when the drive power is about equal to that which asymptotically would be expected to cause the power to reach a maximum value. This input drive level is herein referred to as the "zero dB input backoff point".

At a zero dB input backoff point, the relationship between the value "a" and the amplitude compression of the output power is as follows:

| "a" | output power compression |
|---|---|
| 2 | 3 dB |
| 3 | 2 dB |
| 6 | 1 dB |
| 12 | 0.5 dB |

Figure 16:
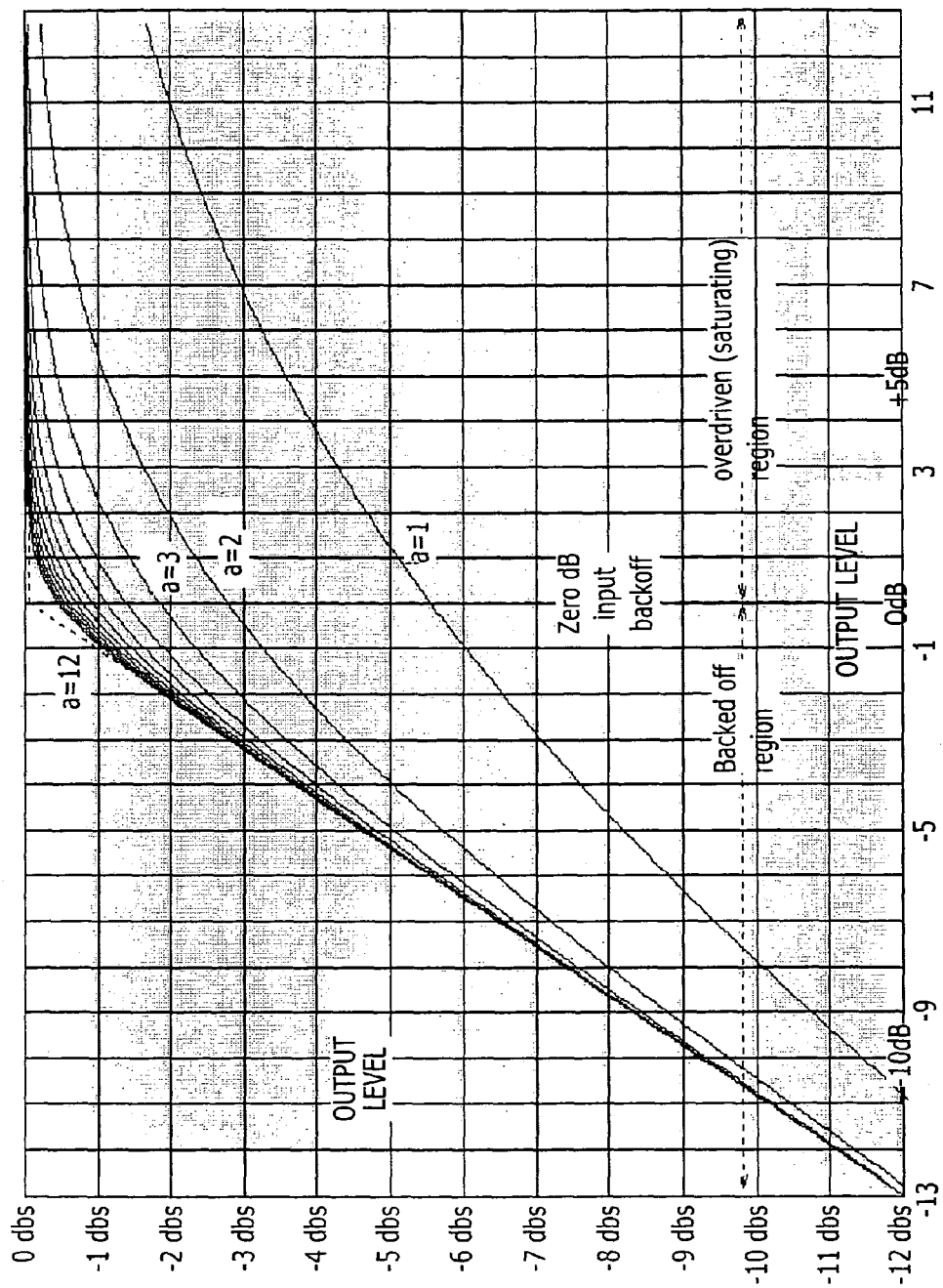
FIG. 16 illustrates exemplary distortion curve relationships for input level to output level ratios for a power amplifier.

The value "a" determines the sharpness of the transition from linear operation into saturated or non-linear operation. For example, FIG. 16 shows example relationships between input levels and output levels for a power amplifier as they vary based on values of "a" between 1 and 12.

For a power amplifier that is not linearized by sophisticated techniques, a compression of 1–2 dB is expected, i.e., "a"=3–6. For a power amplifier that has been linearized by, for example, Cartesian feedback, a high value of "a" would be expected because it is held linear by feedback until the power hits a ceiling. An "a" value of 3 has been used in simulations because that value fits measured data of typical power amplifiers.

For power amplifiers that do not accurately match any of the curves of FIG. 16, the instantaneous high level amplitude modulation values required in the following description may be determined experimentally for each desired output amplitude with the given instantaneous drive signal amplitude.

Figure 17:
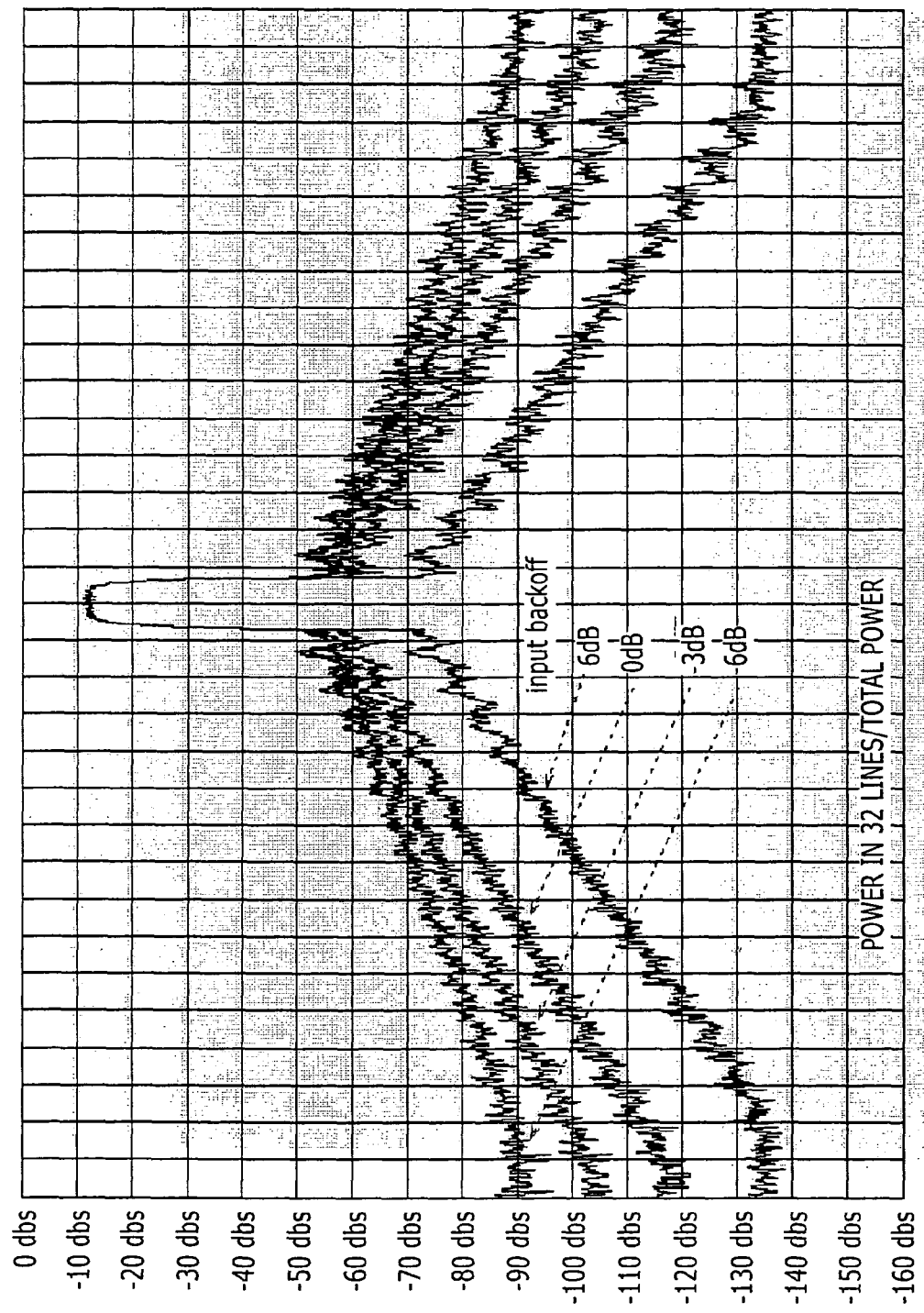
FIG. 17 illustrates the effect of saturation of a power amplifier on the spectral tails that are obtain with C=0.1 and an input signal level with varying backed off and overdriven values.
Figure 18:
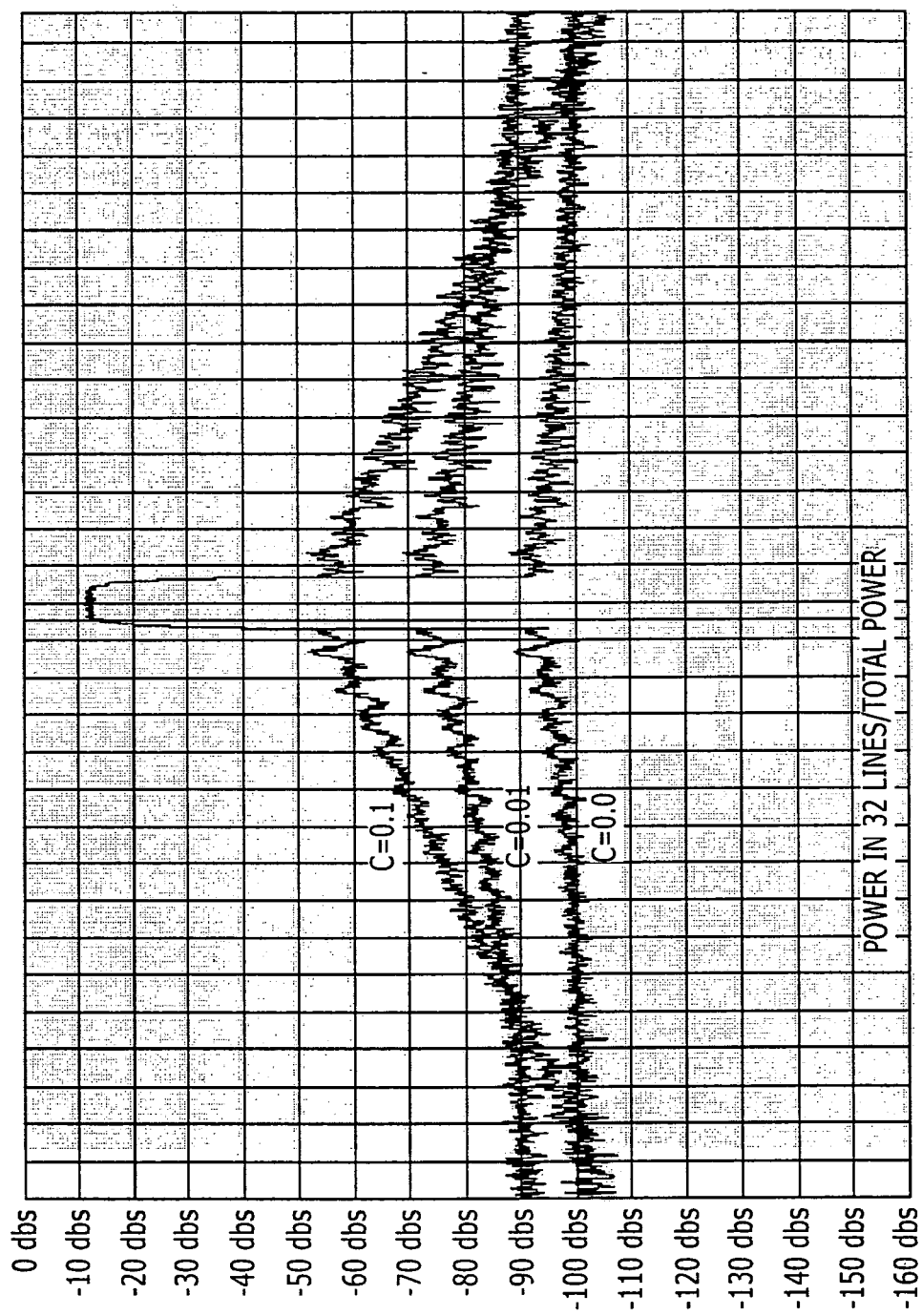
FIG. 18 illustrates spectral tails of an output signal from a power amplifier operating in a saturation region with an input signal level overdriven by 3 dB and varying values of C.

Using the described model for AM/AM distortion with "a"=3, FIG. 17 shows the effect of saturation of a power amplifier on the spectral tails that are obtained with C=0.1 and input backoff amounts of 6 dB, 0 dB, −3 dB and −6 dB. Negative values of backoff indicate that the power amplifier is driven well into the saturating region. In FIG. 17, there is no delay error between amplitude and phase signals. FIG. 18 shows the spectral tails with the input backoff set to −3 dB (i.e., well into the saturating region), and with a C of 0, a C of 0.01, and a C of 0.1. It is noted that when C is 0, the power amplifier operates according to a conventional power modulation where its spectral output is not affected by its non-linearity. Thus, the higher the value of C, which is the greater the departure from conventional polar modulation, the sensitivity to delay error may be reduced, but the sensitivity to power amplifier saturation may be increased.

Figure 19:
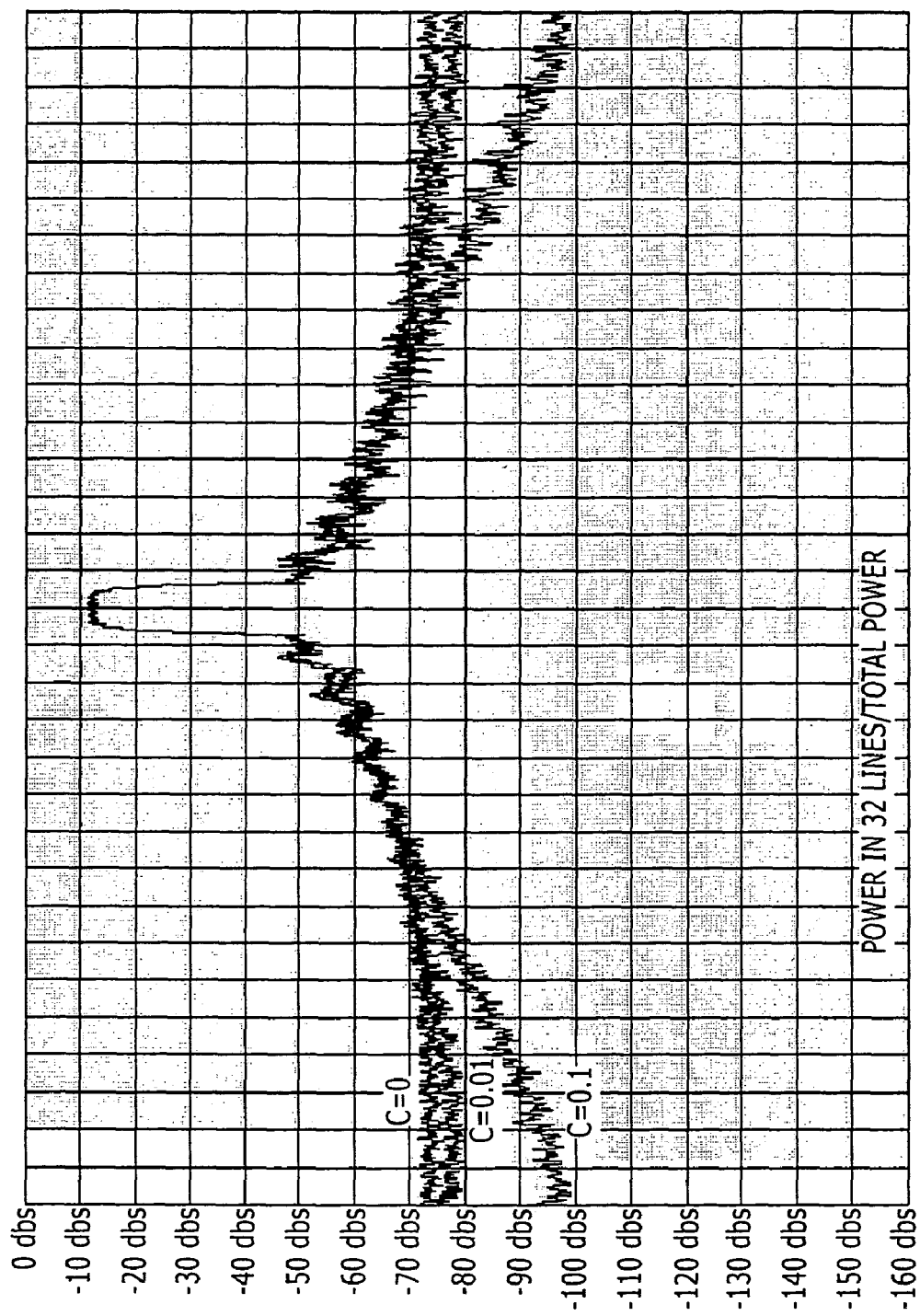
FIG. 19 illustrates the output spectrum of a power amplifier having a 3 dB overdriven input signal and varying values of C.

FIG. 19 shows an example relationship between the sensitivity of a transmitter to I, Q delay errors versus increased sensitivity to power amplifier saturation. The curves illustrate spectral tails versus C values of 0, 0.01, and 0.1 for a fixed input backoff of −3 dB (a power amplifier input overdrive of 3 dB) and a delay error between the amplitude and phase signals of 1/32nd of a symbol period. As shown, the spectral tails are reduced even when the power amplifier is operating well into a saturated region. The non-linearity of the power amplifier does cause a small increase in spectral energy at about 3 channel bandwidths from the channel center.

Figure 20:
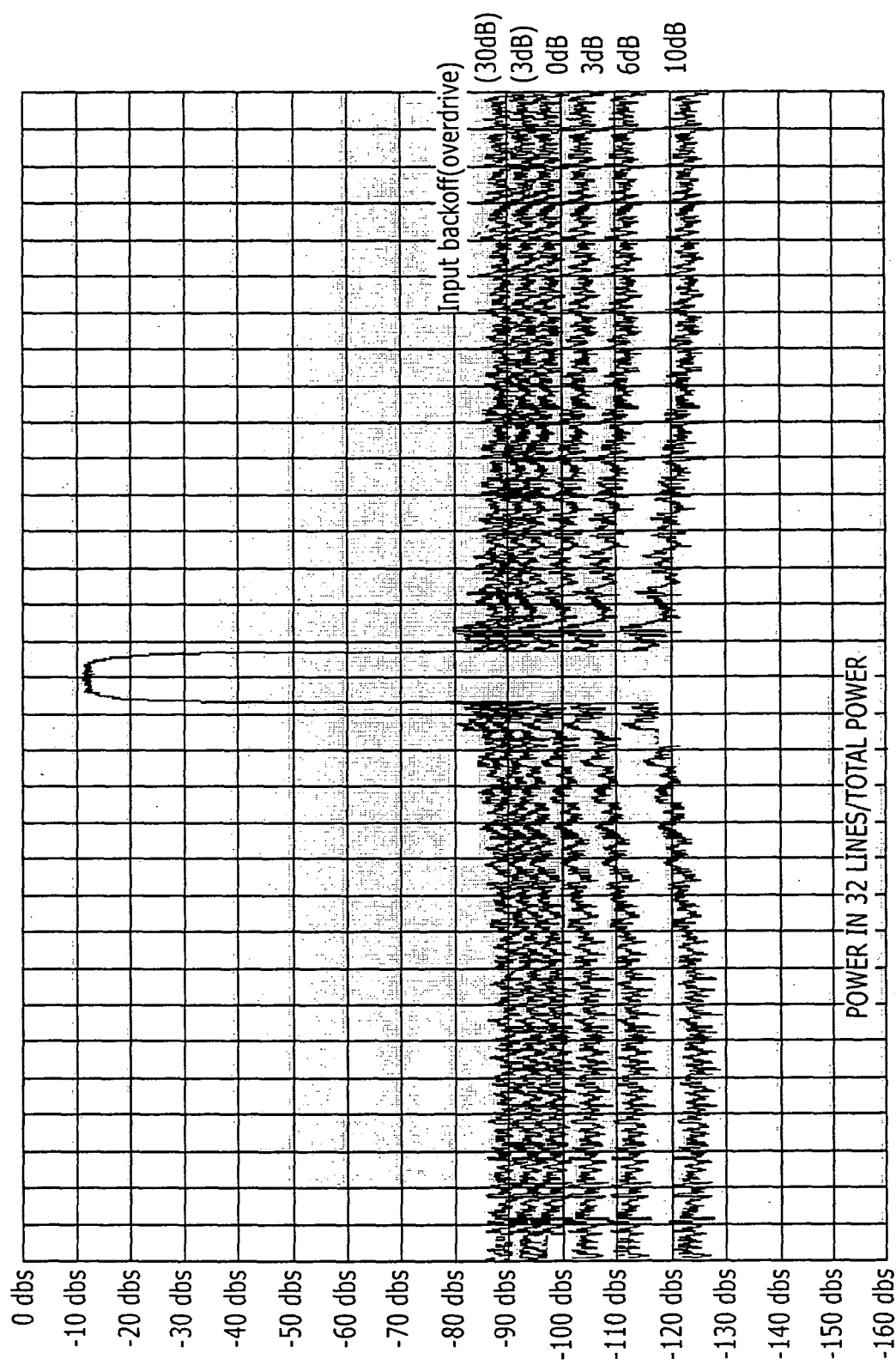
FIG. 20 illustrates the output spectrum of a power amplifier having an amplitude modulation bandwidth limited to 10 times the symbol rate and varying amplitude drive signals.

As suggested above, non-linearity of a power amplifier may be compensated by pre-distorting the amplitude of its drive signal I',Q'. For example, assuming that a power amplifier has AM/AM distortion as modeled above, the original I,Q waveform may be used as a drive signal to the power amplifier without computing modified values I',Q', so that the full amplitude variation of the drive signal may be provided to the power amplifier. Accordingly, in such case, multipliers 202 and 203 may be removed from FIG. 15. The high-level amplitude modulator 102 may now be considered to modulate the amplifier saturation level Vsat while leaving the gain unchanged. For example, the amplitude modulator 102 can modulate the supply voltage to the power amplifier 103 while keeping the bias and quiescent current of the power amplifier 103 constant. When Vsat is modulated proportionally to the signal amplitude |I,Q|, it may be seen that the denominator term in equation 1 is constant, irrespective of the value of "a". This condition applies to any value of power amplifier overdrive or backoff. The amplitude of the output signal is then proportional to the amplitude of the numerator term. FIG. 20 shows the sensitivity of the spectrum to an amplitude remodulation bandwidth limit of 20 symbol rates for varying power amplifier drive levels. When the power amplifier is under driven (i.e., input backoff), the input signal amplitude fluctuations are reproduced more accurately, giving lower spectral tails. When the amplifier is over driven (i.e., drive signal higher than the 0 dB input backoff level), the output amplitude is determined less by the input amplitude and more by the bandlimited amplitude modulation signal from the amplitude modulator 102 (FIG. 14), thereby allowing the bandwidth limit to affect the spectral tails more adversely.

Figure 21:
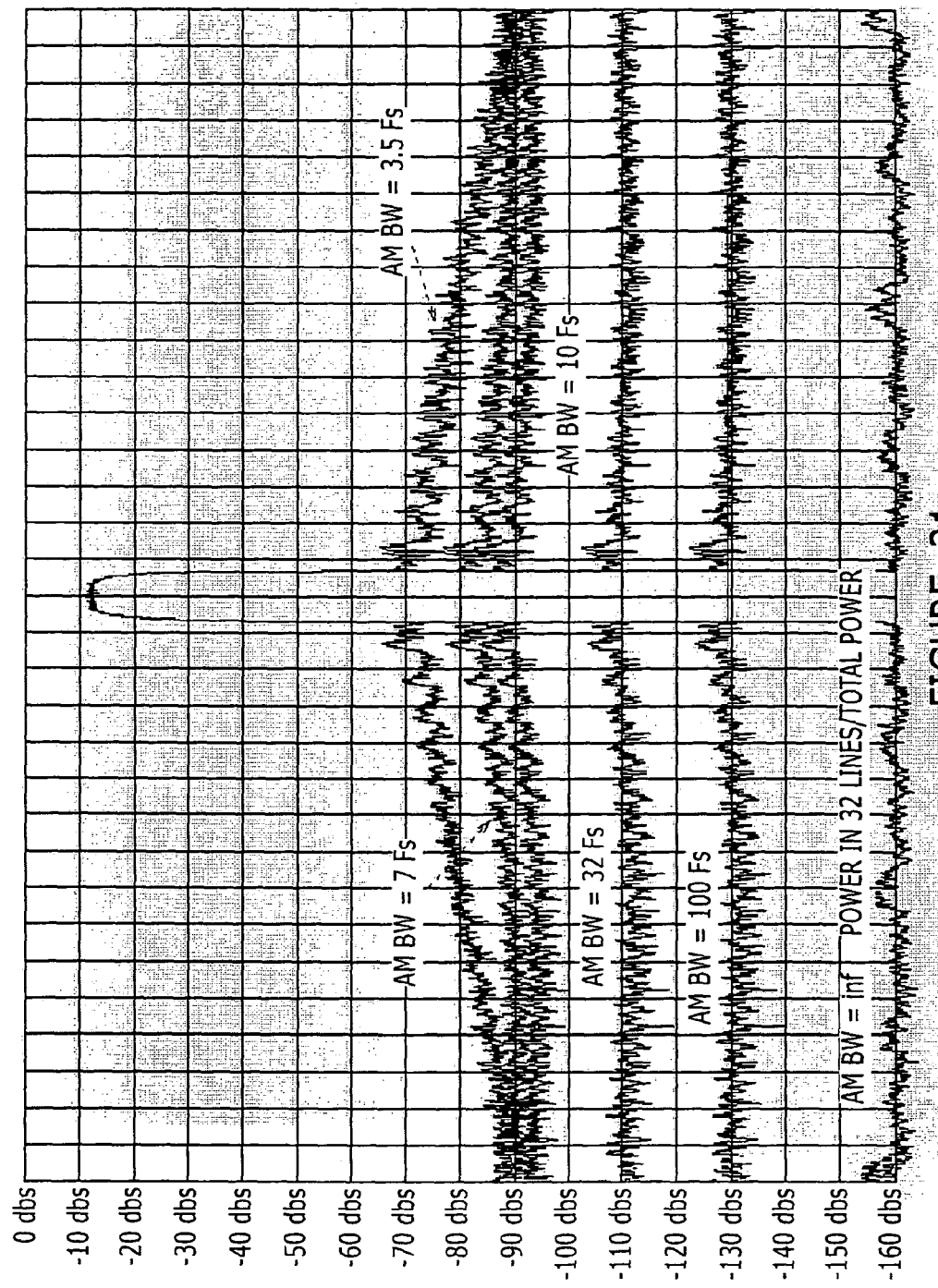
FIG. 21 illustrates the output spectrum of a power amplifier with an amplitude remodulation that is bandwidth limited to 7 times the symbol rate and an input signal level overdriven by 3 dB.

The effect of bandlimiting the high level amplitude remodulation signal to different bandwidths, expressed as a multiple of the symbol rate, is shown in FIG. 21 for the case of an input drive level 3 dB above the 0 dB input backoff point.

Figure 22:
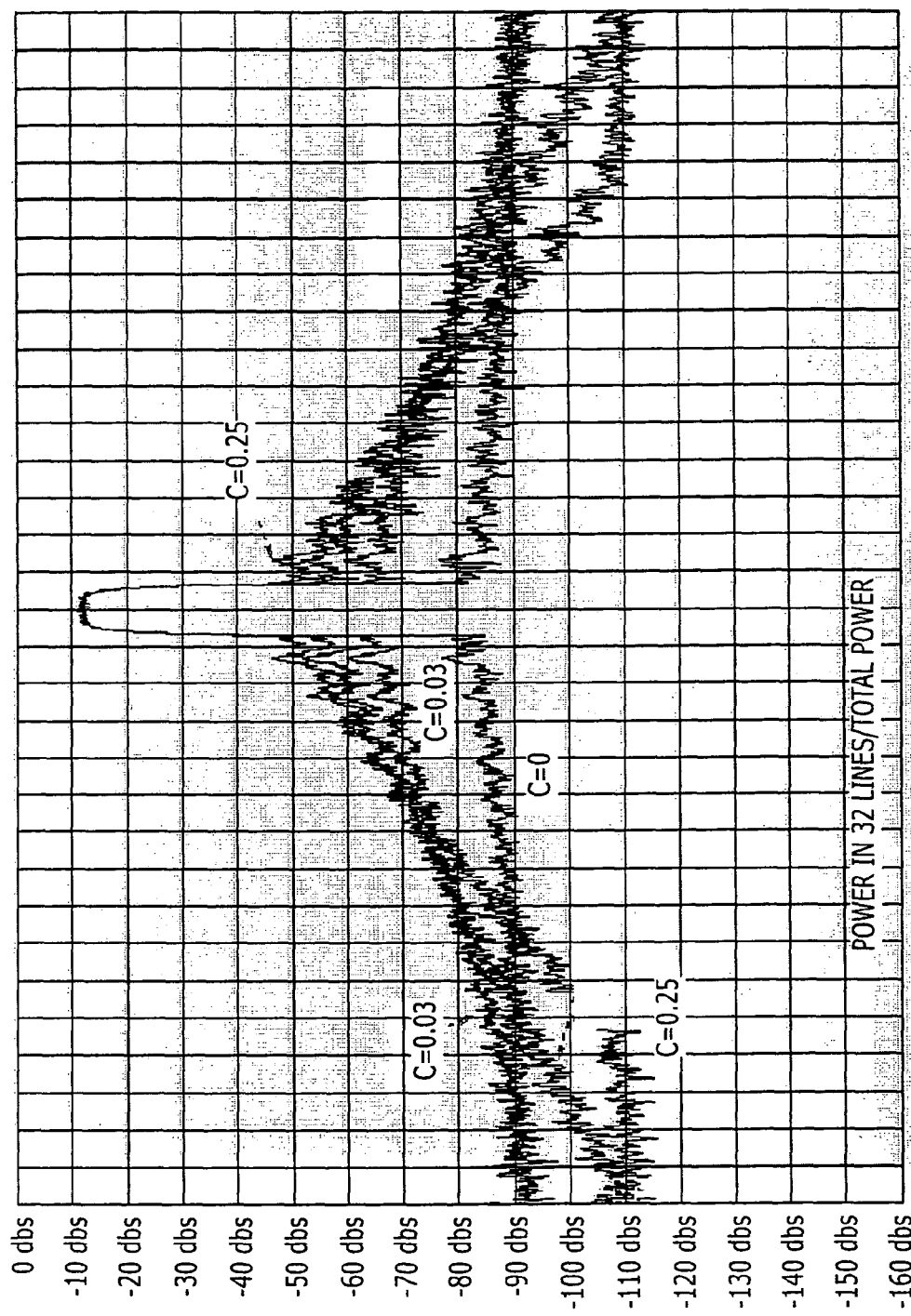
FIG. 22 illustrates the effect of C values on the output spectrum of a power amplifier having an amplitude modulated drive signal and a modified amplitude remodulation signal.

The effect of modifying the amplitude remodulation signal before bandlimiting, using for example, a non-zero value of the constant C, is shown in FIG. 22 for a fixed value of the bandwidth limit of 7 symbol rates. The value of 7 was selected for illustration purposes based on a practical signal oversampling of 16 times the symbol rate, and the bandwidth of the smoothing filter being slightly less than the Nyquist frequency of 8 symbol rates to permit practical filters to be designed. It is evident that modification of the amplitude remodulation waveform allows a trade off between close-in and far-out spectral energy, and which may provide reduction of far-out energy while still obtaining adequate adjacent channel suppression values around 40 dB.

Figure 23:
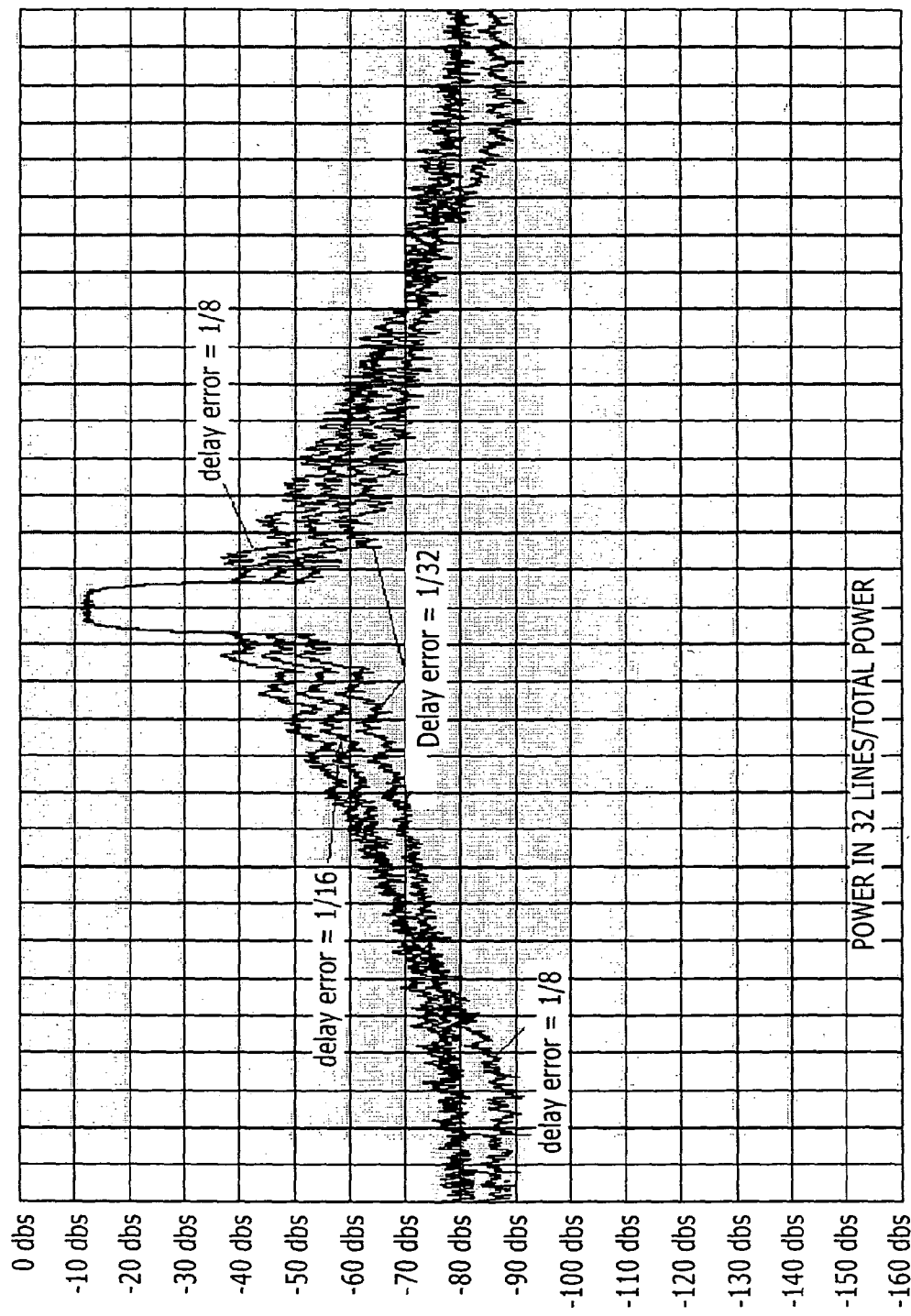
FIG. 23 illustrates the effect of delay error on the output spectrum of a power amplifier having an input signal level overdriven by 3 dB.

FIG. 23 shows the effect of delay errors of 1/32nd, 1/16th and 1/8th of a symbol period on spectral tails and with an power amplifier input overdrive of 3 dB.

Figure 24:
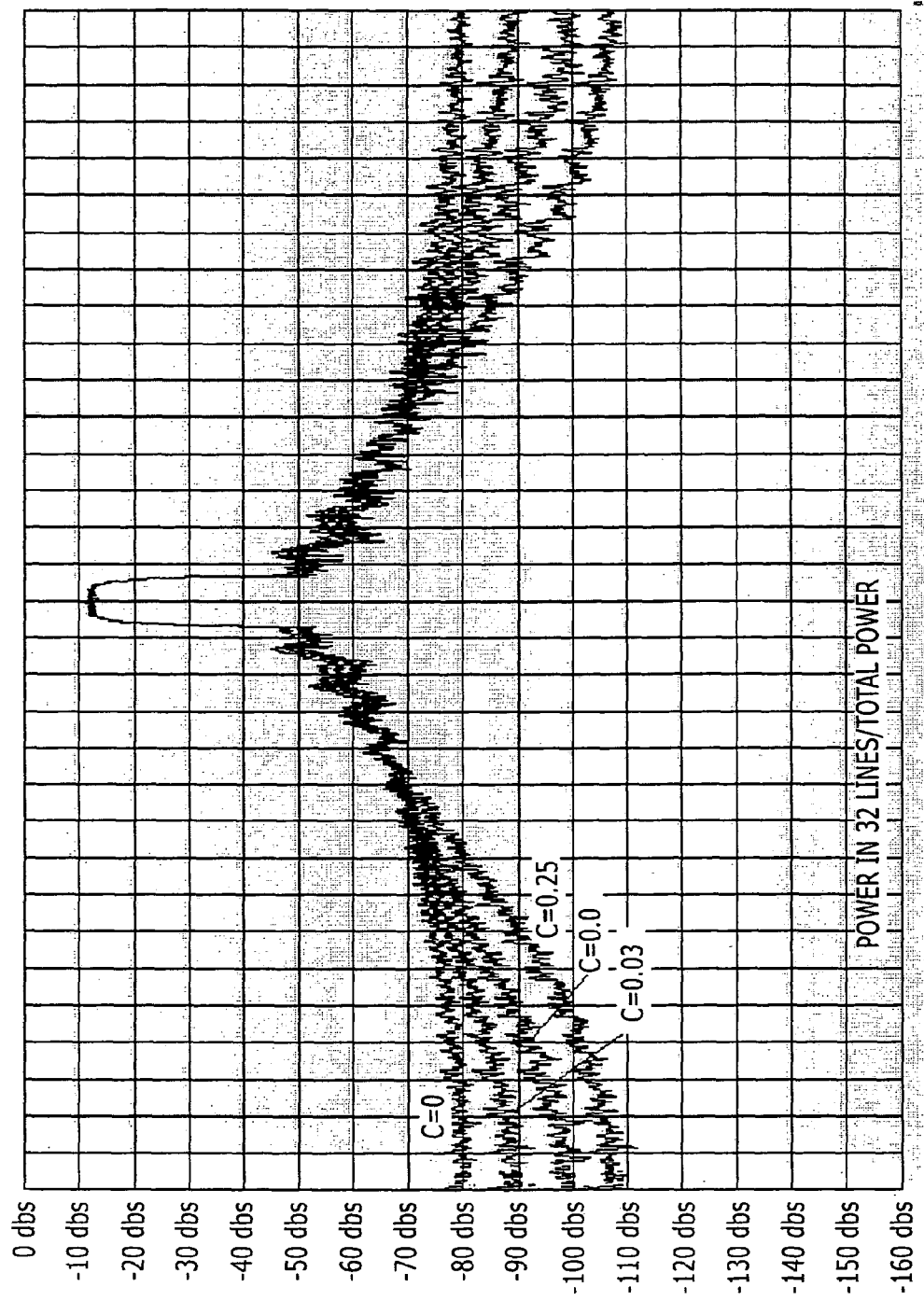
FIG. 24 illustrates the effect of C values on the output spectrum of a power amplifier having an input signal level overdriven by 3 dB and a 1/32 of a symbol period delay error.

A delay error of 1/32 of a symbol period could arise, for example, if the signal originated in a 16-sample per symbol form and the phase signal samples were delayed to the nearest sample to match the amplitude signal delay, thereby giving an error of up to half of one sample period. FIG. 24 shows the reduction in spectral tails that may be obtained for various non-zero values of the constant C for a power amplifier input overdrive of 3 dB and a delay error of 1/32 of a symbol period. The improved spectral tails are obtained with only small degradation of adjacent channel energy close to the carrier.

Figure 25:
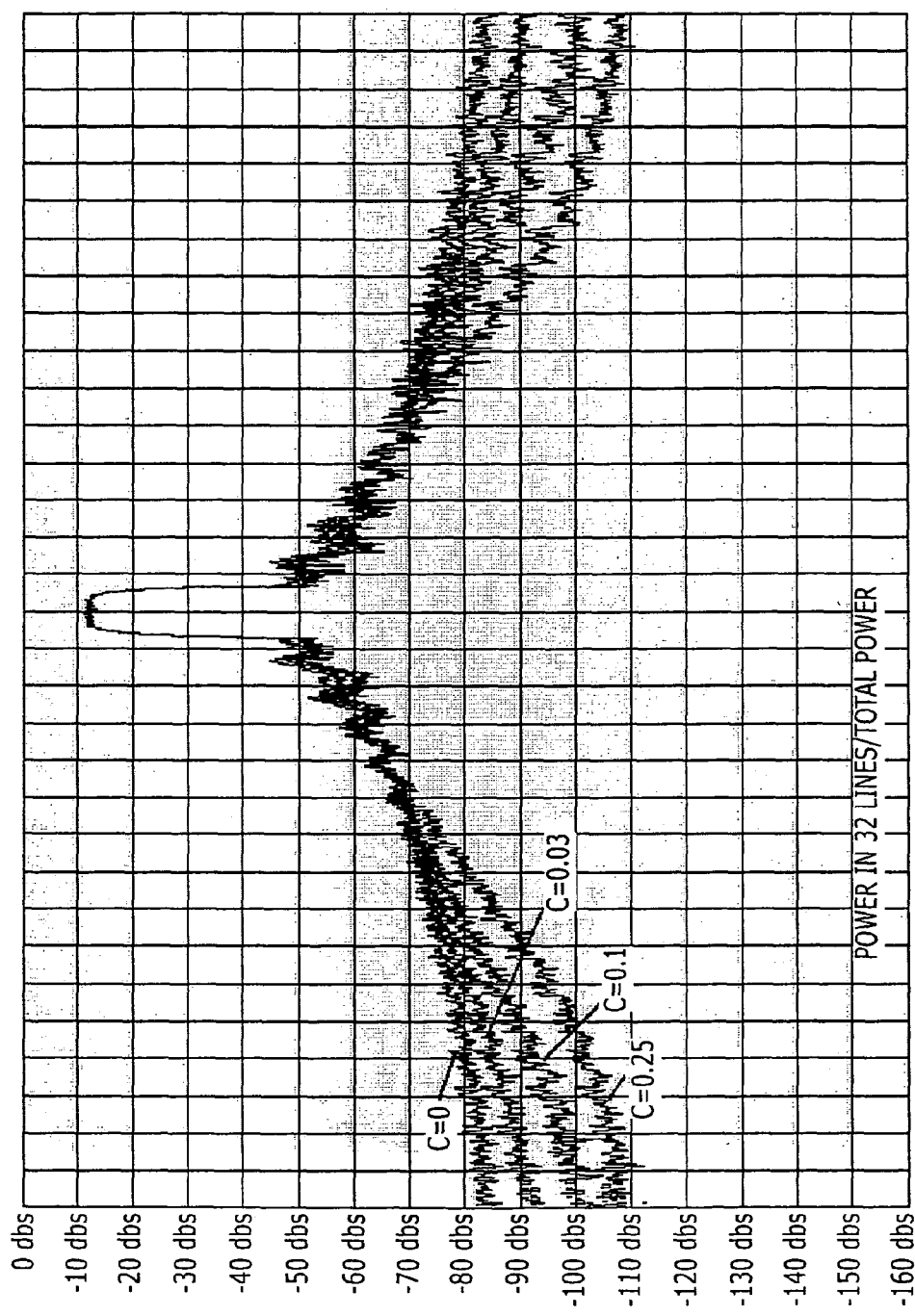
FIG. 25 illustrates the effect of C values on the output spectrum of a power amplifier having an input signal level overdriven by 3 dB, a delay error of 1/32 of a symbol period, and an amplitude remodulation bandwidth limited to 7 times the symbol rate.

In contrast to FIG. 22 that illustrates a non-zero amplitude waveform modifying constant C for a case of AM bandwidth limitation only, and no delay error, and FIG. 24 that illustrates the case of delay error but no bandwidth limitation, FIG. 25 shows the case of both bandwidth limitation and delay error with C values of 0, 0.03, 0.1, and 0.25, a delay error of 1/32 of a symbol period, AM bandwidth of 7 symbol rates, and 3 dB overdrive of the amplifier input signal.

Figure 26:
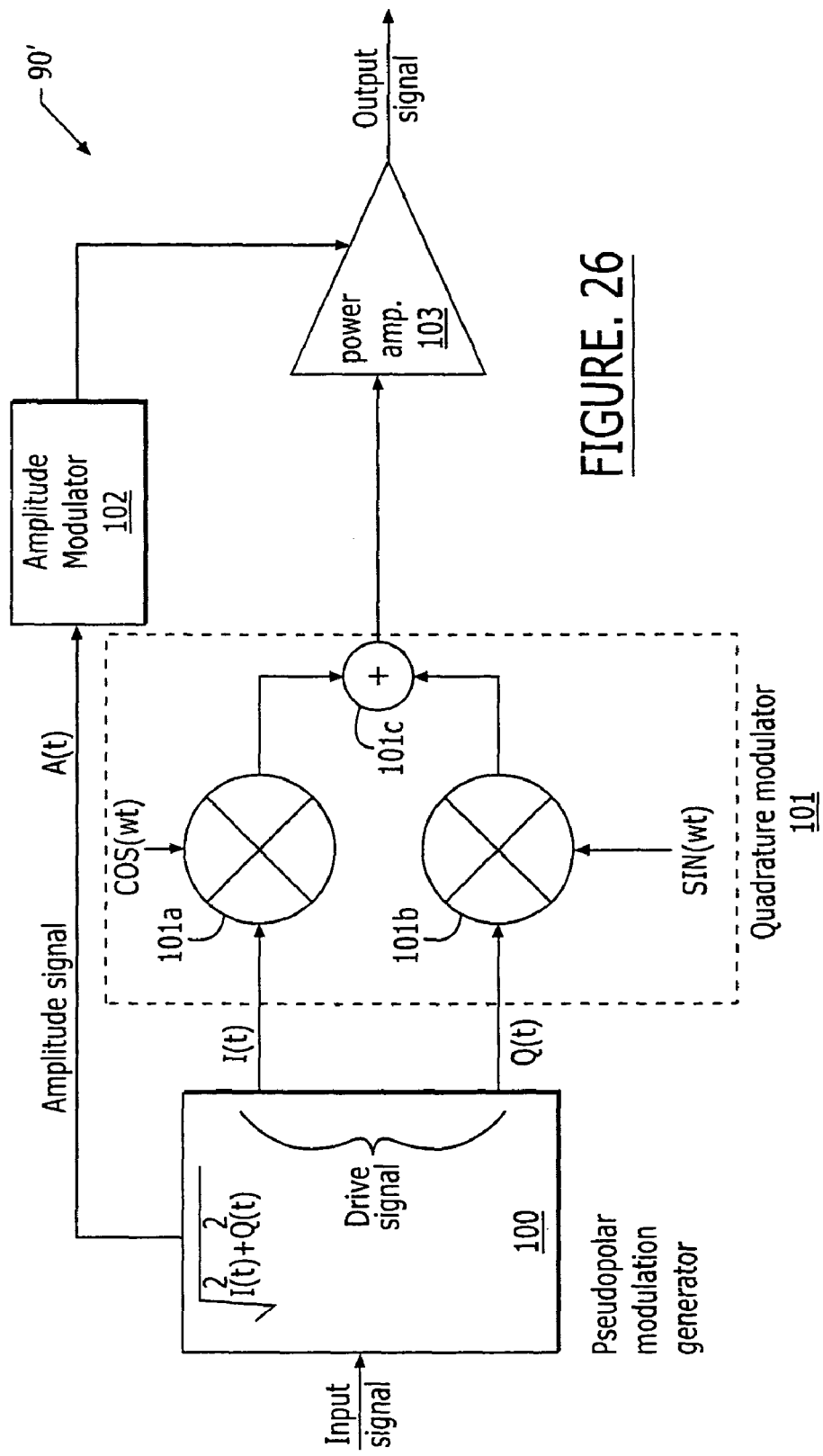
FIG. 26 shows a block diagram for radio transmitter according to some embodiments of the present invention.

FIG. 26 shows a block diagram of a transmitter 90' according to some embodiments of the invention that may be used, for example, to generate the spectral tail reductions that are shown in FIGS. 23–25. Elements that may be similar between FIGS. 26 and 23–25 have the same numbering. However, differences can include, for example, that the pseudopolar modulation generator 100 may generate different signals in response to the same input signal. For example, the pseudopolar modulation generator 100 shown in FIG. 26 may, after converting the input signals to intended I,Q modulations signals, output those signals unmodified to the quadrature modulator 101, and generate the amplitude signal A(t) from the square root of $I^2+Q^2$ and provide it unmodified to the amplitude modulator 102. The amplitude modulator 102 in FIG. 26 modulates the output/input curve (e.g. the curves of FIG. 16) so that the saturation point, which might be defined as the intersection between the two asymptotes labeled "0 dB Input Backoff" in FIG. 16, tracks the variation of the amplitude that is output from the quadrature modulator 101. The power amplifier 103 may then operate with the same amount of compression in dB for all amplitude levels, and may, thereby, generate an output signal that is proportional to the input amplitude with a constant dB difference. When there is no delay error or amplitude bandwidth limitation, the spectrum of the output signal from the power amplifier 103 corresponds to that shown in FIG. 20 for an infinite amplitude remodulation bandwidth.

Figure 27:
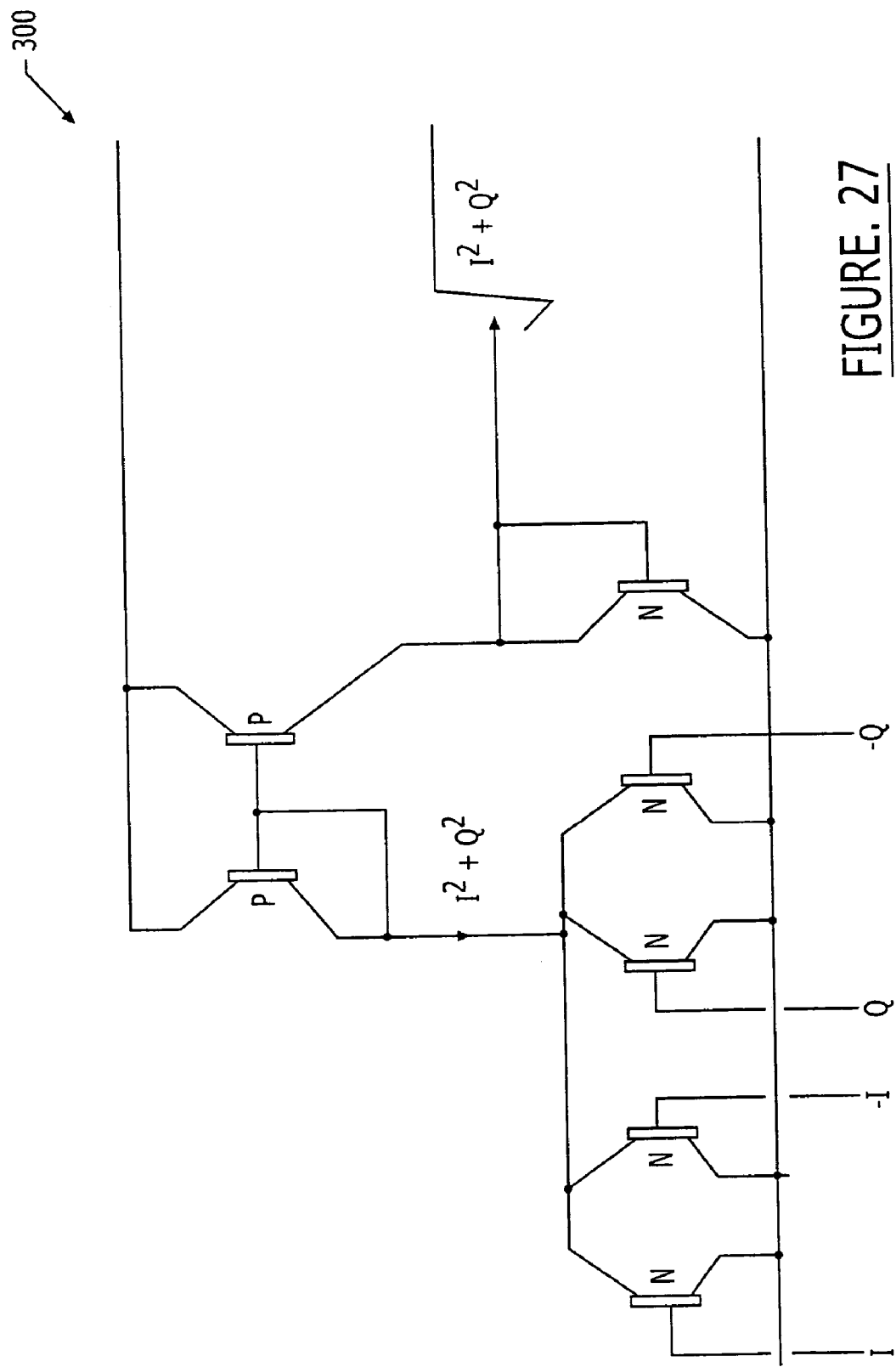
FIG. 27 shows a circuit diagram for a pseudopolar modulation generator according to some embodiments of the present invention.

The finite I,Q sampling rate of the pseudopolar modulation generator 100 can result in a limitation of the bandwidth of the amplitude remodulation. For the bandlimited I,Q signals themselves, the sampling rate limitation is not as important. However, for the wider bandwidth amplitude signal that is derived therefrom, the sample rate limitation can be significant. Alternative operations for deriving amplitude without sample rate limitations can include converting the numerical samples of I,Q to continuous time waveforms, and then converting the continuous-time I,Q waveforms to a continuous-time amplitude waveform using an analog circuit that effectively forms the square root of $I^2+Q^2$ in a continuous manner. FIG. 27 illustrates an analog circuit 300 that may be used for this purpose, and which uses square-law current/voltage conversion devices such as FETs. Four N-type devices 302, 304, 306, and 308 are fed at their control electrodes by I, –I, Q and –Q respectively. Each of the N-type devices 302, 304, 306, and 308 provide a square law function only in one quadrant, and therefore only the I or –I device (302 or 304) conducts a current proportional to $I^2$, and likewise only the Q or –Q device (306 or 308) conducts a current proportional to $Q^2$. The sum of the current conducted by the four N-type devices 302, 304, 306, and 308 is thus $I^2+Q^2$, and this current is reflected by a current mirror formed by the two P-type devices 310 and 312. The control law of the P-devices can be unimportant so long as they are matched. The reflected sum-square current is then applied to the output device 314, and the output of the device 314 is fed back to its input. The voltage on the output device 314 rises until the current it conducts sinks the reflected current. If the output device 314 is also a square-law device, it output voltage will increase until its output voltage squared equals the desired sink current i.e. its output voltage is the square root of the sink current $I^2+Q^2$ as desired.

Figure 28:
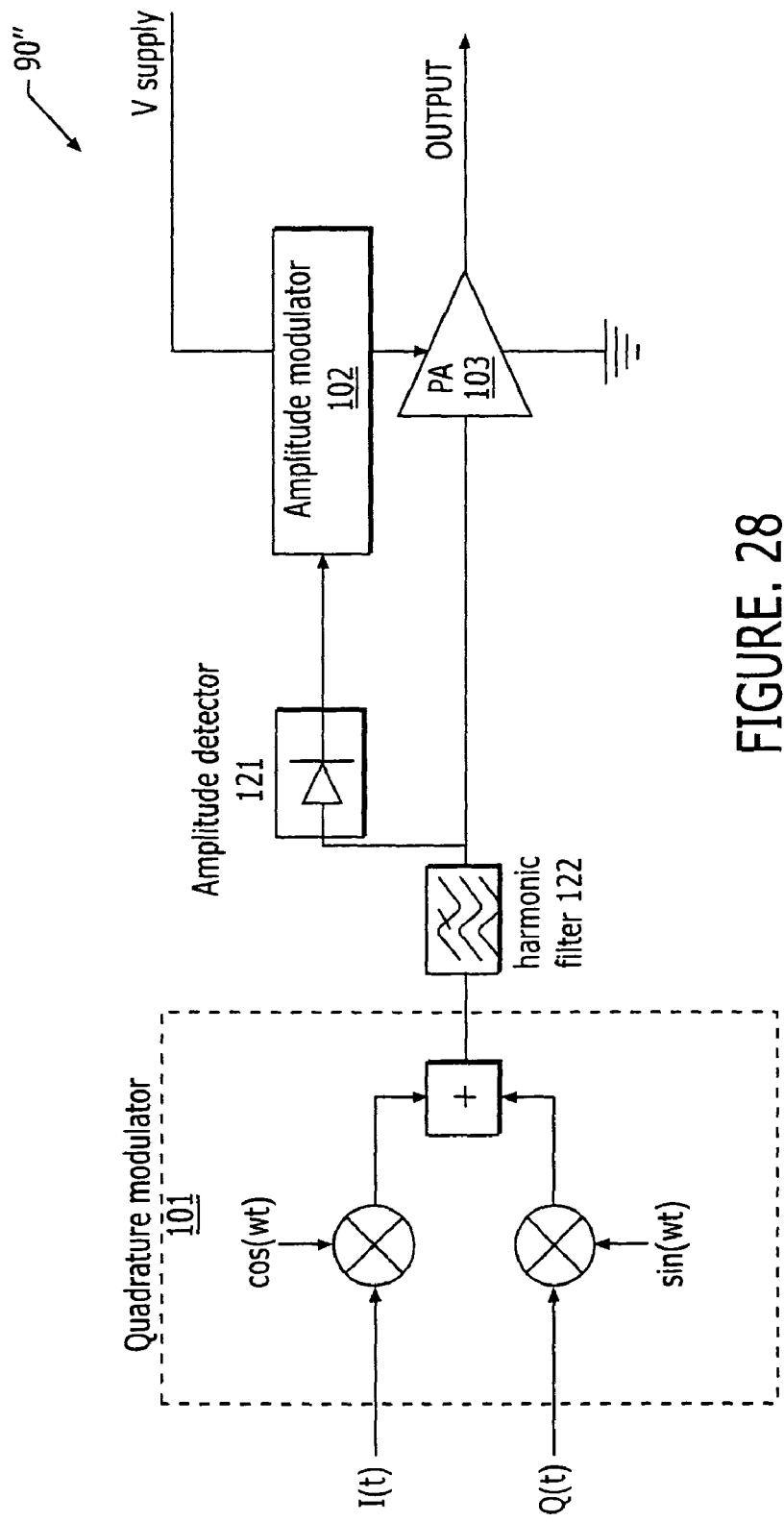
FIG. 28 shows a block diagram for radio transmitter according to some embodiments of the present invention.

FIG. 28 is a block diagram of another transmitter 90" that generates a continuous amplitude waveform from time-continuous I,Q waveforms I(t),Q(t), according to some embodiments of the present invention. The waveforms I(t), Q(t) are applied to a quadrature modulator 101 along with cosine and sine carrier signals cos(wt) and sin(wt). The I-modulated cosine and the Q-modulated sine carriers are added, and then may be low-pass filtered using a harmonic filter 122 to generate a smoothed modulated fundamental signal. An amplitude detector 121, which may be, for example, a rectifier diode, generates an amplitude modulation signal from the smoothed modulated fundamental signal from the harmonic filter 122. The amplitude modulation signal is applied to the amplitude modulator 102. The amplitude modulator 102 now only needs a sufficiently low bandwidth limitation so as to remove ripple that may be in the amplitude modulation signal at the carrier frequency, due to, for example, ripple caused by the amplitude detector 121. The amplitude modulator 102 modulates the compression point of the power amplifier 103 so as to track the amplitude of the smoothed modulated fundamental signal (drive signal) that is applied to the power amplifier 103 from the harmonic filter 122.

Figure 29:
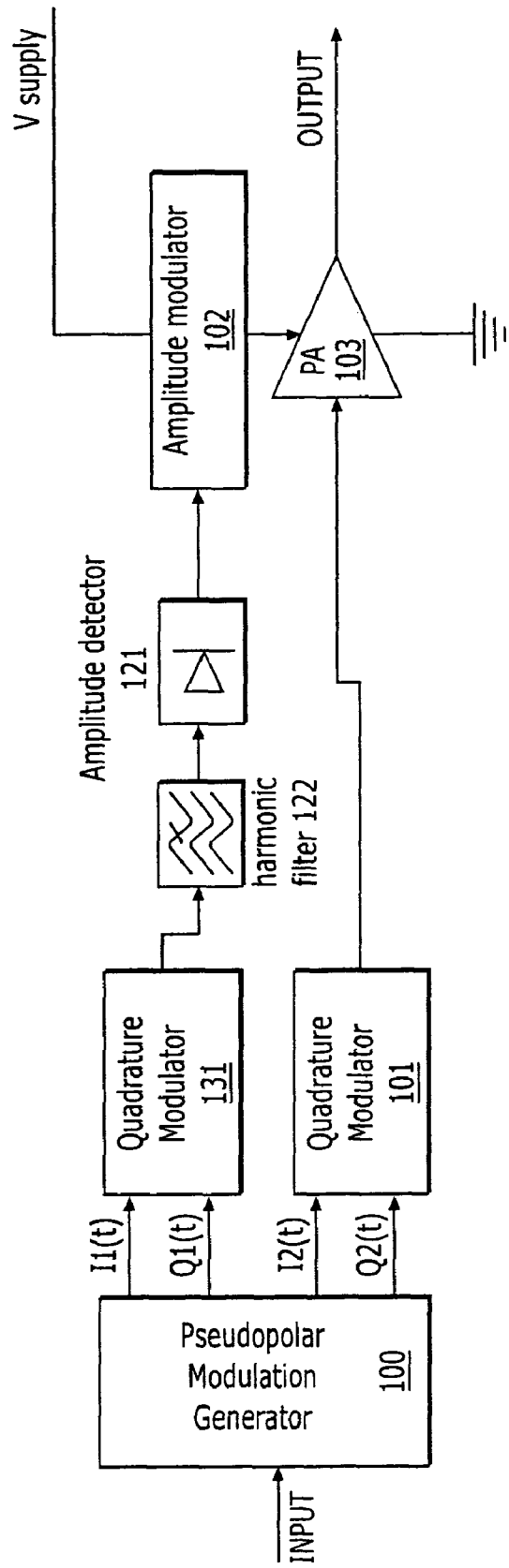
FIG. 29 shows a block diagram for radio transmitter according to some embodiments of the present invention.

The drive signal that is provided to the power amplifier 103 may be predistorted to compensate for amplitude-amplitude non-linearity of, for example, the power amplifier 103 and/or the amplitude modulator 102. Separate quadrature modulators may then be used to form the amplitude modulation signal and the drive signal for the power amplifier 103, for example, as shown in FIG. 29. A pseudopolar modulation generator 100 generates a first pair of continuous-time I,Q signals $(I_1(t),Q_1(t))$ and a second pair of I,Q signals $(I_2(t),Q_2(t))$, and which may be generated in a digital signal processor from a sampled input signal. The sampled I,Q signals may then be converted to an analog signal by a digital-to-analog converter and low-pass filtered to form a continuous time signal that can be used by the psudopolar modulation generator 100.

A first quadrature modulator 131 modulates the first pair of continuous-time I,Q signals $(I_1(t),Q_1(t))$ onto a high frequency signal. The first quadrature modulator 131 may operate at any carrier frequency, not necessarily one that is related to the desired output frequency of the power amplifier 103, because its output is only detected by a detector 121 to produce the amplitude modulating waveform provided to the amplitude modulator 102.

Figure 30:
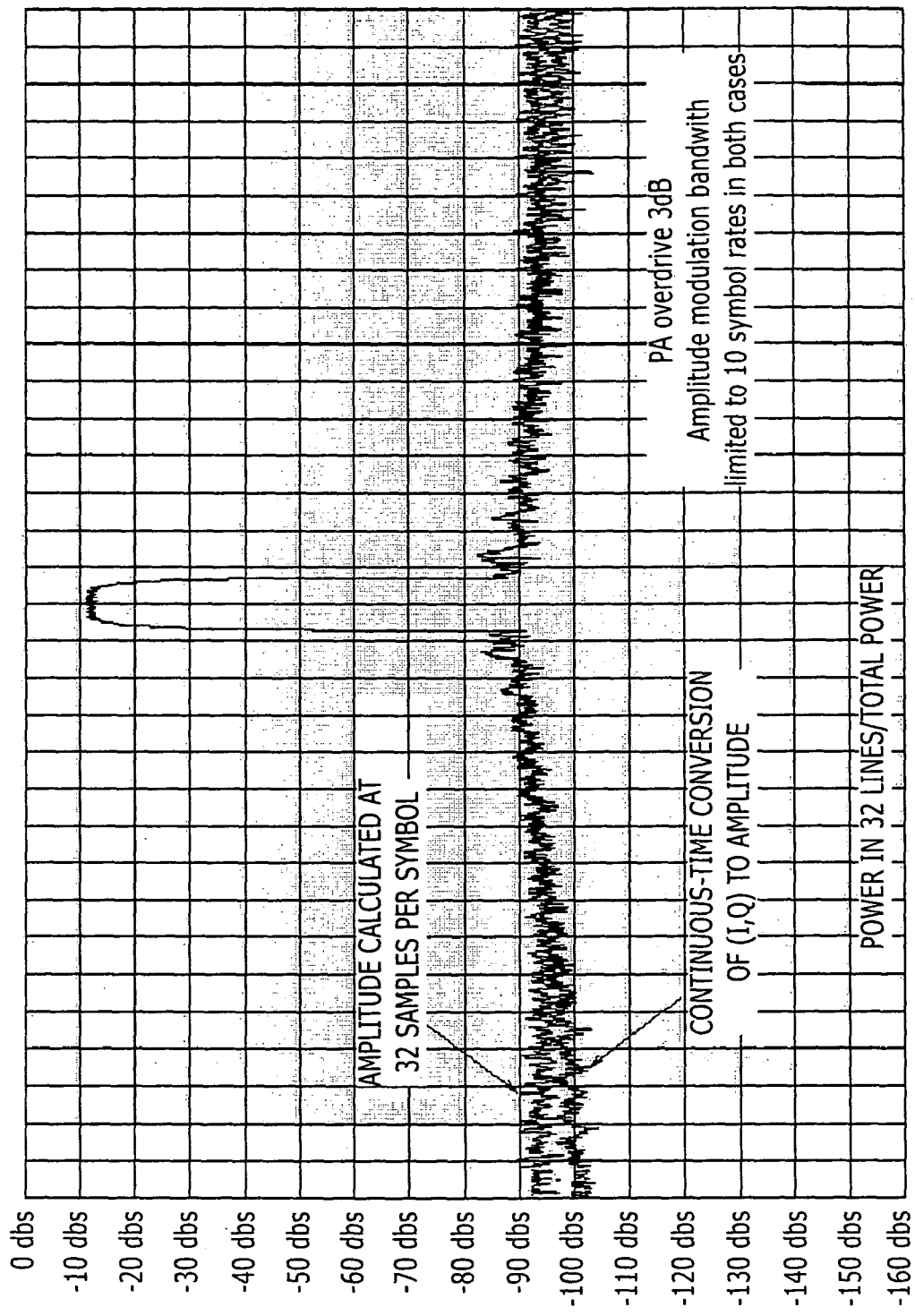
FIG. 30 illustrates the output spectrum of a power amplifier that uses continuous time conversion of I,Q values and a power amplifier that uses sampled conversion of I,Q values.

The second quadrature modulator 101 modulates the second pair of I,Q signals $(I_2(t),Q_2(t))$ onto a carrier signal that has a frequency equal to the desired frequency of the output signal of the power amplifier 103. The modulated carrier signal is then provided as a drive signal to the power amplifier 103. The second pair of I,Q signals $(I_2(t),Q_2(t))$ may be formed to include amplitude and/or phase compensation to compensate for amplitude non-linearity and/or for amplitude/phase conversion (AM/PM distortion) in the power amplifier 103. For example, because the amplitude modulator 102 may have bandwidth limitations that can prevent amplitude troughs from exhibiting an ideal sharp cusp, the second pair of I,Q signals $(I_2(t),Q_2(t))$ may be formed with an exaggerated downward modulation so as to obtain the desired output signal from power amplifier 103. The second pair of I,Q signals $(I_2(t),Q_2(t))$ may alternatively be constant envelope drive signals, or may have an almost constant amplitude but with some residual amplitude modulation as in the earlier-described embodiments to render the out-of-channel spectral tails less sensitive to imperfections such as amplitude modulation delay and/or bandwidth limitation. FIG. 30 shows the spectral tails that may be obtained using continuous-time (I,Q)-to-amplitude conversion compared with those obtained using sampled (I,Q)-to-amplitude conversion. As shown, approximately 10 dB improvement may be obtained even when the amplitude modulation bandwidth limitation is unchanged at 10 times the symbol rate.

The continuous-time I,Q to amplitude conversion that is provided by the transmitter shown in FIG. 29 may have a relative delay between the amplitude waveform and the power amplifier drive "phase signal" that may be adjusted to a greater precision, not limited by an I,Q sample rate, as would otherwise occur when using sampled amplitude conversion. For example, the first pair of continuous-time I,Q signals $(I_1(t),Q_1(t))$ that are provided to the quadrature modulator 131 may be generated from a given data bit, chip or symbol sequence as values that are time-displaced compared to the second pair of I,Q signals $(I_2(t),Q_2(t))$ fed to the quadrature modulator 101. The second pair of I,Q signals $(I_2(t),Q_2(t))$ may be generated by passing data bit, chip or symbol impulses through a root-raised cosine or other transmit shaping filter, which may be a finite impulse response filter defined by known coefficients. The coefficients may be symbol-spaced samples of the filter impulse response. The symbol-spaced sample grid may be shifted across the impulse response to generate different sets of coefficients that corresponding to the same filter, but with different delays. In this way, selection of the appropriate set of coefficients can adjust the delay with as fine a resolution as desired. These operations may also be used for the transmitters that are shown in FIGS. 26 and 27 to adjust the relative timing of the amplitude modulation signal, which is used to modulate the amplitude of the power amplifier output signal, compared to the drive signal, which is used to drive the input of the power amplifier.

The transmitters shown in FIGS. 14, 26, 27, 28 and 29 may form the amplitude modulation signal, used to modulate the amplitude of the output signal, using I,Q signals that are based on empirical measurements of a typical power amplifier. Empirical measurements may be used to determine, for each expected drive signal amplitude, the value of the amplitude modulation signal required to give the desired output amplitude, and thereby precompensate for power amplifier amplitude-amplitude non-linearities.

Figure 31:
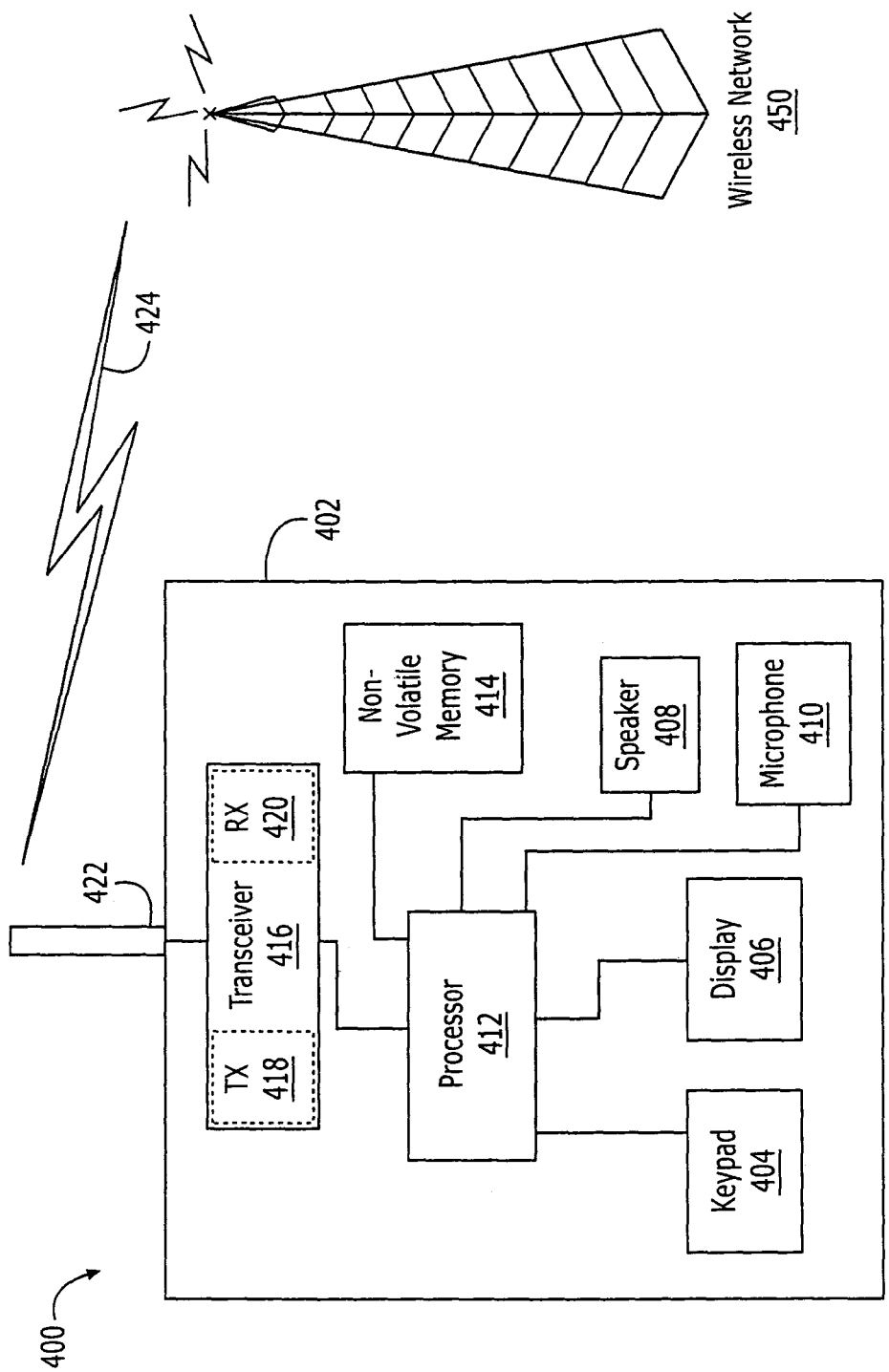
FIG. 31 illustrates a block diagram of a wireless communication system according to some embodiments of the present invention.

FIG. 31 illustrates a wireless communication system that includes a wireless terminal 400 and a wireless network 450.

The wireless terminal 400 may include a portable housing 402, a keyboard/keypad 404, a display 406, a speaker 408, and a microphone 410. The keyboard/keypad 404 and/or the microphone 410 are a user interface that is configured to generate an information signal from information that is input by a user. The wireless terminal 400 also includes a processor 412, a memory 414, and a transceiver 416. The nonvolatile memory 414 may include, for example, one or more erasable programmable read-only memories (EPROM or Flash EPROM), battery-backed random access memory (RAM), magnetic, optical, or other digital storage device, and may be separate from, or at least partially within, the processor 412. The transceiver 416 typically includes both a transmitter 418 and a receiver 420 to allow two way communications, but the present invention is not limited to such devices and, as used herein, a "transceiver" may include both a receiver 420 and a transmitter 418 or only the transmitter 418. The wireless terminal 400 may, thereby, communicate with the wireless communications network 450 using radio frequency signals. The radio frequency signals may be communicated through an antenna 422 over at least one communication channel 424 with the wireless communications network 450.

The transmitter 418 may be, for example, one of the transmitters that are shown in FIGS. 14, 26, 27, 28 and 29. The transmitter 418 may be implemented by radio frequency, analog and/or digital hardware, and/or computer program instructions. Accordingly, the transmitter 418 may include a general purpose processor, special purpose computer, ASIC, and/or other programmable data processing apparatus.

It should be understood, that, as used herein, the term "wireless terminal" may include a cellular radiotelephone with or without a multi-line display; a Personal Communications System (PCS) terminal that may combine a cellular radiotelephone with data processing, facsimile and data communications capabilities; a Personal Data Assistant (PDA) that can include a radiotelephone, pager, Internet/intranet access, Web browser, organizer, calendar and/or a global positioning system (GPS) receiver; and a conventional laptop and/or palmtop portable computer that includes a radiotelephone transceiver. Wireless terminals may also be referred to as "pervasive computing" devices.

Although the present invention has been described and illustrated in the context of a CDMA cellular communication system. It is to be understood, however, that the principles of the present invention may be applied to any cellular or wireless device utilizing one or more air interfaces, such as, for example, ANSI-136, GSM, wideband-CDMA, CDMA2000, Enhanced Data rates for GSM Evolution (EDGE), Universal Mobile Telecommunications System (UMTS), frequency division multiple access, Bluetooth, and wireless local area network (WLAN) protocols, including IEEE 802.11b, and the like. It should be further understood that the principles of the present invention may be utilized in hybrid systems that are combinations of two or more air interfaces. In addition, the methods and transmitters described herein may be embodied in a wireless terminal, a wireless network (e.g., base station), and/or another wireless communication device.

As has been explained herein, various modifications of an amplitude modulation waveform and a drive signal for a power amplifier can produce a polar modulation transmitter with improved spectral characteristics and/or reduced sensitivity to imperfections such as relative delay, power amplifier non-linearity and/or bandwidth limitations. Accordingly, a person having skill in the art can make adaptations of the exemplary embodiments without departing from the spirit and scope of the invention as defined by the attached claims.

What is claimed is:

1. A method of modulating a radio transmitter, the method comprising:
    generating an amplitude modulation signal based on in-phase (I) and quadrature (Q) components of an information signal, wherein the amplitude modulation signal has a reduced predetermined characteristic compared to the magnitude of the I and Q components of the information signal; and
    forming a complex signal having substantially the same phase angle variation as the I and Q components of the information signal so that the product of the complex signal and the amplitude modulation signal is substantially equal to the information signal.

2. The method of claim 1, wherein the amplitude modulation signal is generated to have a reduced peak-to-trough amplitude relative to the information signal.

3. The method of claim 1, wherein the amplitude modulation signal is generated to have a reduced spectral width relative to the information signal magnitude.

4. The method of claim 1, further comprising dividing the I and Q components of the information signal by the amplitude modulation signal to generate a scaled information signal.

5. The method of claim 4, further comprising amplifying the scaled information signal with a variable amplification based on the amplitude modulation signal.

6. The method of claim 1, wherein the amplitude modulation signal is generated based on the following equation:

$\sqrt{I^2+Q^2+C}$, wherein C is a non-zero constant.

7. The method of claim 6, further comprising combining the complex information signal with a carrier signal to generate a channel information signal that is at least partially within a channel frequency range, and wherein C is selected to reduce a portion of the channel information signal spectrum that is outside of the channel frequency range.

8. A method of controlling a power amplifier in a radio transmitter, the method comprising:
    generating a power amplifier saturation control signal based on in-phase (I) and quadrature (Q) components of an information signal;
    generating a drive signal based on the information signal; and
    controlling the power amplifier with the power amplifier saturation control signal so that it has a substantially constant amount of saturation while the amplitude of the drive signal changes.

9. A method of controlling a power amplifier in a radio transmitter, the method comprising:
    generating first and second information signals, each having in-phase (I) and quadrature (Q) components, from an input signal;
    generating an amplitude modulation signal based on magnitude of the I and Q components of the second information signal;
    generating a drive signal to the power amplifier based on the I and Q components of the first information signal; and
    varying amplification of the drive signal by the power amplifier based on the amplitude modulation signal.

10. The method of claim 9, wherein generating an amplitude modulation signal is based on the square root of the sum of the squares of the I and Q components of the second information signal.

11. The method of claim 9, wherein generating an amplitude modulation signal based on magnitude of the I and Q components of the second information signal comprises:
combining the second information signal with a radio frequency carrier signal to form a second radio frequency information signal; and
detecting amplitude variation in the second radio frequency information signal.

12. The method of claim 11, wherein the second radio frequency carrier signal has a different radio frequency than the drive signal.

13. The method of claim 9, wherein generating first and second information signals, each having in-phase (I) and quadrature (Q) components, from an input signal, comprises delaying one of the first and second information signals relative to the other one of the first and second information signals.

14. The method of claim 13, wherein generating first and second information signals, each having in-phase (I) and quadrature (Q) components, from an input signal, comprises filtering the first information signal with a first finite impulse response (FIR) filter and filtering the second information signal with a second FIR filter, wherein the first and second FIR filters have the same signal transfer frequency response and different delays.

15. The method of claim 13, further comprising delaying one of the first and second information signals relative to the other one of the first and second information signals to compensate for delay between the amplitude modulation signal and the drive signal.

16. The method of claim 9, wherein the input signal is a sampled digital signal, and wherein the generating first and second information signals, each having in-phase (I) and quadrature (Q) components, from an input signal, comprises converting the sampled digital signal to the first and second information signals having continuous waveforms.

17. The method of claim 9, wherein generating a drive signal to the power amplifier based on the I and Q components of the first information signal comprises:
modulating the first information signal using a first quadrature modulator operating at a first radio frequency to generate a modulated first information signal; and
modulating the second information signal using a second quadrature modulator operating at a second radio frequency to generate a modulated second information signal.

18. The method of claim 17, wherein the first radio frequency is different than the second radio frequency.

19. The method of claim 18, wherein the second radio frequency has a substantially constant frequency over time and the first radio frequency varies in frequency over time.

20. The method of claim 10, wherein generating an amplitude modulation signal based on magnitude of the I and Q components of the second information signal, comprises generating the amplitude modulation signal as the square root of the sum of the squares of the I and the Q components of the second information signal.

21. The method of claim 9, wherein the second information signal is generated based on known non-linearity of the power amplifier so that the ratio of the output signal from the power amplifier to the input signal is substantially linear.

22. The method of claim 9, wherein generating a drive signal to the power amplifier based on the I and Q components of the first information signal comprises forming the I and Q components of the first information signal using knowledge of the non-linearity of the power amplifier.

23. The method of claim 9, wherein the second information signal is generated so that it has a lower peak to trough ratio than the input signal magnitude.

24. The method of claim 9, wherein the second information signal is generated so out-of-channel spectral tails of the second information signal are reduced relative to spectral components of the amplitude variation of the input signal.

25. A radio transmitter comprising:
a pseudopolar modulation generator that is configured to generate an amplitude modulation signal based on in-phase (I) and quadrature (Q) components of an information signal, wherein the amplitude modulation signal has a reduced predetermined characteristic compared to the magnitude of the I and Q components of the information signal;
a quadrature modulator that is configured to combine the information signal with a carrier signal to generate a channel information signal; and
a power amplifier that is configured to amplify the channel information signal with a variable amplification based on the amplitude modulation signal.

26. The radio transmitter of claim 25, wherein the pseudopolar modulation generator generates the amplitude modulation signal with reduced peak-to-trough amplitude ratio compared to the information signal.

27. The radio transmitter of claim 25, wherein the pseudopolar modulation generator is configured to generate the amplitude modulation signal with reduced spectral tails compared to the spectral tails of the amplitude of the information signal.

28. The radio transmitter of claim 25, wherein the pseudopolar modulation generator is configured to generate the amplitude modulation signal based on the following equation:

$$\sqrt{I^2+Q^2+C}, \text{ wherein C is a non-zero constant.}$$

29. The radio transmitter of claim 28, wherein C is selected to reduce a portion of the spectrum of the amplified channel information signal output by the power amplifier that is outside of an allocated frequency channel.

30. The radio transmitter of claim 25, further comprising an amplitude modulator that is configured to modulate a supply voltage to the power amplifier based on the amplitude modulation signal.

31. The radio transmitter of claim 25, wherein the quadrature modulator is configured to divide the I and Q components of the information signal by the amplitude modulation signal to generate a scaled information signal, and is further configured to combine the scaled information signal with the carrier signal to generate the channel information signal.

32. The radio transmitter of claim 25, wherein the pseudpolar modulation generator comprises analog circuitry that is configured to generate the amplitude modulation signal as an analog signal.

33. The radio transmitter of claim 32, wherein the pseudpolar modulation generator comprises analog square-law voltage-current conversion devices.

34. The radio transmitter of claim 33, wherein the analog square-law voltage-current conversion devices comprise field-effect transistors.

35. The radio transmitter of claim 25, wherein the psuedopolar modulation generator comprises a digital processor that is configured to generate the amplitude modulation signal as a digital signal.

36. A wireless terminal comprising:
- a user interface that is configured to generate an information signal from information that is input by a user; and
- a radio transmitter comprising:
    - a pueudopolar modulation generator that is configured to generate an amplitude modulation signal based on in-phase (I) and quadrature (Q) components of the information signal, wherein the amplitude modulation signal has a reduced predetermined characteristic compared to the magnitude of the I and Q components of the information signal;
    - a quadrature modulator that is configured to combine the information signal with a carrier signal to generate a channel information signal; and
    - a power amplifier that is configured to amplify the channel information signal with a variable amplification based on the amplitude modulation signal.

37. A wireless base station comprising:
- a wireless network that is configured to receive an information signal for transmission to a wireless terminal; and
- a radio transmitter comprising:
    - a psuedopolar modulation generator that is configured to generate an amplitude modulation signal based on in-phase (I) and quadrature (Q) components of the information signal, wherein the amplitude modulation signal has a reduced predetermined characteristic compared to the magnitude of the I and Q components of the information signal;
    - a quadrature modulator that is configured to combine the information signal with a carrier signal to generate a channel information signal; and
    - a power amplifier that is configured to amplify the channel information signal with a variable amplification based on the amplitude modulation signal.

38. A computer program product for modulating an information signal having in-phase (I) and quadrature (Q) components for transmission by a radio transmitter, the computer program product comprising program code embodied in a computer-readable storage medium, the computer program code comprising:
- program code for generating an amplitude modulation signal based on in-phase (I) and quadrature (Q) components of the information signal, wherein the amplitude modulation signal has a reduced predetermined characteristic compared to the magnitude of the I and Q components of the information signal;
- program code for forming a complex signal having substantially the same phase angle variation as the I and Q components of the information signal so that the product of the complex signal and the amplitude modulation signal is substantially equal to the information signal.

* * * * *

UNITED STATES PATENT AND TRADEMARK OFFICE
CERTIFICATE OF CORRECTION

PATENT NO.         : 7,126,999 B2
APPLICATION NO.    : 10/639164
DATED              : October 24, 2006
INVENTOR(S)        : Paul W. Dent It is certified that error appears in the above-identified patent and that said Letters Patent is hereby corrected as shown below:

Column 8, line 19, "I(t)A′(t)" should be changed to --I(t)/A′(t)--.

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,126,999 B2
APPLICATION NO. : 10/639164
DATED : October 24, 2006
INVENTOR(S) : Dent It is certified that error appears in the above-identified patent and that said Letters Patent is hereby corrected as shown below:

In Column 8, Line 15, delete "$A^2(t)=I_2(t)+Q^2(t),$" and insert -- $A^2(t)=I^2(t)+Q^2(t)$, --, therefor.

In Column 8, Line 17, delete "I'(t)=I(t)A'(t)," and insert -- I'(t)=I(t)/A'(t), --, therefor.

In Column 10, Line 11, Equation 1, delete " 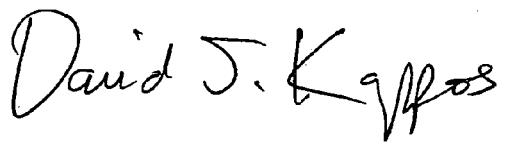 " and insert --

$$Output\_Signal = \frac{(I,Q)}{(1+\left[\frac{|I,Q|}{Vsat}\right]^a)^{1/a}}$$

--.

Signed and Sealed this

Fifteenth Day of December, 2009

David J. Kappos
*Director of the United States Patent and Trademark Office*